(12) United States Patent
Henning et al.

(10) Patent No.: US 9,673,283 B2
(45) Date of Patent: Jun. 6, 2017

(54) POWER MODULE FOR SUPPORTING HIGH CURRENT DENSITIES

(75) Inventors: Jason Patrick Henning, Carrboro, NC (US); Qingchun Zhang, Cary, NC (US); Sei-Hyung Ryu, Cary, NC (US); Anant Kumar Agarwal, Chapel Hill, NC (US); John Williams Palmour, Cary, NC (US); Scott Allen, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/588,329

(22) Filed: Aug. 17, 2012

(65) Prior Publication Data
US 2013/0207123 A1 Aug. 15, 2013

Related U.S. Application Data

(60) Provisional application No. 61/533,254, filed on Sep. 11, 2011.

(51) Int. Cl.
| | | |
|---|---|---|
| *H01L 29/16* | (2006.01) | |
| *H01L 29/739* | (2006.01) | |
| *H01L 29/78* | (2006.01) | |
| *H01L 29/06* | (2006.01) | |
| *H01L 21/04* | (2006.01) | |
| *H01L 27/06* | (2006.01) | |

(Continued)

(52) U.S. Cl.
CPC ........ *H01L 29/1608* (2013.01); *H01L 21/046* (2013.01); *H01L 21/049* (2013.01); *H01L 25/18* (2013.01); *H01L 27/0629* (2013.01); *H01L 29/0696* (2013.01); *H01L 29/7395* (2013.01); *H01L 29/7802* (2013.01); *H01L 29/045* (2013.01); *H01L 29/66068* (2013.01); *H01L 2924/0002* (2013.01); *H01L 2924/13091* (2013.01); *H02M 7/003* (2013.01); *H02P 7/04* (2016.02)

(58) Field of Classification Search
CPC .................. H01L 29/1608; H01L 29/7395
See application file for complete search history.

(56) References Cited

U.S. PATENT DOCUMENTS

| | | |
|---|---|---|
| 3,439,189 A | 4/1969 | Petry |
| 3,629,011 A | 12/1971 | Tohi et al. |

(Continued)

FOREIGN PATENT DOCUMENTS

| | | |
|---|---|---|
| DE | 3942640 A1 | 8/1990 |
| DE | 19809554 A1 | 9/1998 |

(Continued)

OTHER PUBLICATIONS

PCT/JP2009/003111.*

(Continued)

*Primary Examiner* — Bilkis Jahan
(74) *Attorney, Agent, or Firm* — Anthony J. Josephson

(57) ABSTRACT

A power module is disclosed that includes a housing with an interior chamber wherein multiple switch modules are mounted within the interior chamber. The switch modules comprise multiple transistors and diodes that are interconnected to facilitate switching power to a load. In one embodiment, at least one of the switch modules supports a current density of at least 10 amperes per cm$^2$.

39 Claims, 14 Drawing Sheets

(51) Int. Cl.
*H01L 25/18* (2006.01)
*H01L 29/66* (2006.01)
*H01L 29/04* (2006.01)
*H02M 7/00* (2006.01)
*H02P 7/03* (2016.01)

(56) References Cited

U.S. PATENT DOCUMENTS

| | | | |
|---|---|---|---|
| 3,924,024 A | 12/1975 | Naber et al. | |
| 4,160,920 A | 7/1979 | Courier de Mere | |
| 4,242,690 A | 12/1980 | Temple | |
| 4,466,172 A | 8/1984 | Batra | |
| 4,581,542 A | 4/1986 | Steigerwald | |
| 4,644,637 A | 2/1987 | Temple et al. | |
| 4,811,065 A | 3/1989 | Cogan | |
| 4,875,083 A | 10/1989 | Palmour | |
| 4,927,772 A | 5/1990 | Arthur et al. | |
| 4,945,394 A | 7/1990 | Palmour et al. | |
| 4,946,547 A | 8/1990 | Palmour et al. | |
| 5,005,462 A * | 4/1991 | Jasper et al. | 89/8 |
| 5,011,549 A | 4/1991 | Kong et al. | |
| 5,028,977 A | 7/1991 | Kenneth et al. | |
| 5,032,888 A | 7/1991 | Seki | |
| 5,111,253 A | 5/1992 | Korman et al. | |
| 5,155,289 A | 10/1992 | Bowles et al. | |
| 5,170,231 A | 12/1992 | Fujii et al. | |
| 5,170,455 A | 12/1992 | Goossen et al. | |
| 5,184,199 A | 2/1993 | Fujii et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,270,554 A | 12/1993 | Palmour | |
| 5,292,501 A | 3/1994 | Degenhardt et al. | |
| 5,296,395 A | 3/1994 | Khan et al. | |
| 5,348,895 A | 9/1994 | Smayling et al. | |
| 5,371,383 A | 12/1994 | Miyata et al. | |
| 5,384,270 A | 1/1995 | Ueno et al. | |
| 5,385,855 A | 1/1995 | Brown et al. | |
| RE34,861 E | 2/1995 | Davis et al. | |
| 5,393,993 A | 2/1995 | Edmond et al. | |
| 5,393,999 A | 2/1995 | Malhi et al. | |
| 5,396,085 A | 3/1995 | Baliga | |
| 5,459,107 A | 10/1995 | Palmour et al. | |
| 5,468,654 A | 11/1995 | Harada et al. | |
| 5,479,316 A | 12/1995 | Smrtic et al. | |
| 5,488,236 A | 1/1996 | Baliga et al. | |
| 5,506,421 A | 4/1996 | Palmour | |
| 5,510,281 A | 4/1996 | Ghezzo et al. | |
| 5,510,630 A | 4/1996 | Agarwal et al. | |
| 5,523,589 A | 6/1996 | Edmond et al. | |
| 5,539,217 A | 7/1996 | Edmond et al. | |
| 5,545,905 A | 8/1996 | Muraoka et al. | |
| 5,587,870 A | 12/1996 | Anderson et al. | |
| 5,629,531 A | 5/1997 | Palmour et al. | |
| 5,703,383 A | 12/1997 | Nakayama | |
| 5,710,059 A | 1/1998 | Rottner et al. | |
| 5,726,463 A | 3/1998 | Brown et al. | |
| 5,726,469 A | 3/1998 | Chen | |
| 5,734,180 A | 3/1998 | Malhi | |
| 5,739,564 A | 4/1998 | Kosa et al. | |
| 5,763,905 A | 6/1998 | Harris et al. | |
| 5,776,837 A | 7/1998 | Palmour et al. | |
| 5,804,483 A | 9/1998 | Harris et al. | |
| 5,814,859 A | 9/1998 | Ghezzo et al. | |
| 5,831,288 A | 11/1998 | Singh et al. | |
| 5,837,572 A | 11/1998 | Gardner et al. | |
| 5,851,908 A | 12/1998 | Harris et al. | |
| 5,877,041 A | 3/1999 | Fuller et al. | |
| 5,877,045 A | 3/1999 | Kapoor et al. | |
| 5,885,870 A | 3/1999 | Maiti et al. | |
| 5,914,500 A | 6/1999 | Bakowski et al. | |
| 5,917,203 A | 6/1999 | Bhatnagar et al. | |
| 5,939,763 A | 8/1999 | Hao et al. | |
| 5,960,289 A | 9/1999 | Tsui et al. | |
| 5,969,378 A | 10/1999 | Singh et al. | |
| 5,972,801 A | 10/1999 | Lipkin et al. | |
| 5,976,936 A | 11/1999 | Miyajima et al. | |
| 5,977,605 A | 11/1999 | Bakowsky et al. | |
| 6,020,600 A | 2/2000 | Miyajima et al. | |
| 6,025,233 A | 2/2000 | Terasawa et al. | |
| 6,025,608 A | 2/2000 | Harris et al. | |
| 6,028,012 A | 2/2000 | Wang | |
| 6,040,237 A | 3/2000 | Bakowski et al. | |
| 6,048,766 A | 4/2000 | Gardner et al. | |
| 6,054,352 A | 4/2000 | Ueno et al. | |
| 6,054,728 A | 4/2000 | Harada et al. | |
| 6,063,698 A | 5/2000 | Tseng et al. | |
| 6,083,814 A | 7/2000 | Nilsson et al. | |
| 6,091,108 A | 7/2000 | Harris et al. | |
| 6,096,607 A | 8/2000 | Ueno et al. | |
| 6,100,169 A | 8/2000 | Suvorov et al. | |
| 6,104,043 A | 8/2000 | Hermansson et al. | |
| 6,107,142 A | 8/2000 | Suvorov et al. | |
| 6,117,735 A | 9/2000 | Ueno et al. | |
| 6,121,633 A | 9/2000 | Singh et al. | |
| 6,133,587 A | 10/2000 | Takeuchi et al. | |
| 6,136,727 A | 10/2000 | Ueno et al. | |
| 6,136,728 A | 10/2000 | Wang | |
| 6,165,822 A | 12/2000 | Okuno et al. | |
| 6,180,958 B1 | 1/2001 | Cooper, Jr. | |
| 6,190,973 B1 | 2/2001 | Berg et al. | |
| 6,204,135 B1 | 3/2001 | Peters et al. | |
| 6,204,203 B1 | 3/2001 | Narwankar et al. | |
| 6,211,035 B1 | 4/2001 | Moise et al. | |
| 6,218,254 B1 | 4/2001 | Singh et al. | |
| 6,218,680 B1 | 4/2001 | Carter, Jr. et al. | |
| 6,221,700 B1 | 4/2001 | Okuno et al. | |
| 6,228,720 B1 | 5/2001 | Kitabatake et al. | |
| 6,238,967 B1 | 5/2001 | Shiho et al. | |
| 6,239,463 B1 | 5/2001 | Williams et al. | |
| 6,239,466 B1 | 5/2001 | Elasser et al. | |
| 6,246,076 B1 | 6/2001 | Lipkin et al. | |
| 6,252,258 B1 * | 6/2001 | Chang et al. | 257/133 |
| 6,252,288 B1 * | 6/2001 | Chang | 257/471 |
| 6,297,100 B1 | 10/2001 | Kumar et al. | |
| 6,297,172 B1 | 10/2001 | Kashiwagi | |
| 6,303,508 B1 | 10/2001 | Alok | |
| 6,310,775 B1 | 10/2001 | Nagatomo et al. | |
| 6,316,791 B1 | 11/2001 | Schörner et al. | |
| 6,316,793 B1 | 11/2001 | Sheppard et al. | |
| 6,329,675 B2 | 12/2001 | Singh et al. | |
| 6,344,663 B1 | 2/2002 | Slater, Jr. et al. | |
| 6,344,676 B1 | 2/2002 | Yun et al. | |
| 6,365,462 B2 | 4/2002 | Baliga | |
| 6,365,932 B1 | 4/2002 | Kouno et al. | |
| 6,388,271 B1 | 5/2002 | Mitlehner et al. | |
| 6,399,996 B1 | 6/2002 | Chang et al. | |
| 6,420,225 B1 | 7/2002 | Chang et al. | |
| 6,429,041 B1 | 8/2002 | Ryu et al. | |
| 6,448,160 B1 | 9/2002 | Chang et al. | |
| 6,455,892 B1 | 9/2002 | Okuno et al. | |
| 6,475,889 B1 | 11/2002 | Ring | |
| 6,515,303 B2 | 2/2003 | Ring | |
| 6,524,900 B2 | 2/2003 | Dahlqvist et al. | |
| 6,534,367 B2 | 3/2003 | Peake et al. | |
| 6,548,333 B2 | 4/2003 | Smith | |
| 6,551,865 B2 | 4/2003 | Kumar et al. | |
| 6,573,534 B1 | 6/2003 | Kumar et al. | |
| 6,593,620 B1 | 7/2003 | Hshieh et al. | |
| 6,610,366 B2 | 8/2003 | Lipkin | |
| 6,627,539 B1 | 9/2003 | Zhao et al. | |
| 6,649,497 B2 | 11/2003 | Ring | |
| 6,653,659 B2 | 11/2003 | Ryu et al. | |
| 6,696,705 B1 | 2/2004 | Barthelmess et al. | |
| 6,703,642 B1 | 3/2004 | Shah | |
| 6,743,703 B2 | 6/2004 | Rodov et al. | |
| 6,767,843 B2 | 7/2004 | Lipkin et al. | |
| 6,861,723 B2 | 3/2005 | Willmeroth | |
| 6,936,850 B2 | 8/2005 | Friedrichs et al. | |
| 6,946,739 B2 | 9/2005 | Ring | |
| 6,956,238 B2 | 10/2005 | Ryu et al. | |
| 6,974,720 B2 | 12/2005 | Sumakeris et al. | |
| 6,979,863 B2 | 12/2005 | Ryu | |
| 7,026,650 B2 | 4/2006 | Ryu et al. | |

(56) References Cited

U.S. PATENT DOCUMENTS

| | | |
|---|---|---|
| 7,074,643 B2 | 7/2006 | Ryu |
| 7,118,970 B2 | 10/2006 | Das et al. |
| 7,125,786 B2 | 10/2006 | Ring et al. |
| 7,221,010 B2 | 5/2007 | Ryu |
| 7,230,275 B2 | 6/2007 | Kumar et al. |
| 7,253,031 B2 | 8/2007 | Takahashi et al. |
| 7,276,747 B2 | 10/2007 | Loechelt et al. |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,407,837 B2 | 8/2008 | Tsuji |
| 7,425,757 B2 | 9/2008 | Takubo |
| 7,498,633 B2 | 3/2009 | Cooper et al. |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 7,829,402 B2 | 11/2010 | Matocha et al. |
| 7,855,384 B2 | 12/2010 | Yamamoto et al. |
| 7,855,464 B2 | 12/2010 | Shikano |
| 8,035,112 B1 | 10/2011 | Cooper et al. |
| 8,541,787 B2 | 9/2013 | Zhang |
| 9,029,945 B2 | 5/2015 | Ryu et al. |
| 9,142,662 B2 | 9/2015 | Ryu et al. |
| 2001/0011729 A1 | 8/2001 | Singh et al. |
| 2001/0033502 A1* | 10/2001 | Blair et al. ............ 363/65 |
| 2001/0050383 A1 | 12/2001 | Hatade et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0071293 A1 | 6/2002 | Eden et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2002/0185679 A1* | 12/2002 | Baliga ............ 257/329 |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0041229 A1 | 3/2004 | Chol et al. |
| 2004/0082116 A1 | 4/2004 | Kub et al. |
| 2004/0183079 A1 | 9/2004 | Kaneko et al. |
| 2004/0207968 A1* | 10/2004 | Martin et al. ............ 361/100 |
| 2004/0211980 A1 | 10/2004 | Ryu |
| 2004/0212011 A1 | 10/2004 | Ryu |
| 2004/0227231 A1 | 11/2004 | Maly et al. |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0082542 A1* | 4/2005 | Sumakeris ............ C30B 29/36 257/77 |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0152100 A1* | 7/2005 | Rodriguez et al. ............ 361/605 |
| 2005/0181536 A1 | 8/2005 | Tsuji |
| 2005/0230686 A1 | 10/2005 | Kojima et al. |
| 2005/0275055 A1 | 12/2005 | Parthasarathy et al. |
| 2006/0011128 A1 | 1/2006 | Ellison et al. |
| 2006/0055027 A1* | 3/2006 | Kitabatake et al. ............ 257/706 |
| 2006/0060884 A1 | 3/2006 | Ohyanagi et al. |
| 2006/0071295 A1* | 4/2006 | Chang ............ 257/510 |
| 2006/0086997 A1 | 4/2006 | Kanaya et al. |
| 2006/0108589 A1 | 5/2006 | Fukuda et al. |
| 2006/0211210 A1 | 9/2006 | Bhat et al. |
| 2006/0216896 A1 | 9/2006 | Saito et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2006/0270103 A1 | 11/2006 | Das et al. |
| 2007/0066039 A1 | 3/2007 | Agarwal et al. |
| 2007/0090415 A1 | 4/2007 | Ronsisvalle |
| 2007/0096081 A1 | 5/2007 | Sugawara |
| 2007/0114606 A1* | 5/2007 | Hoshino et al. ............ 257/341 |
| 2007/0120148 A1 | 5/2007 | Nogome |
| 2007/0164321 A1 | 7/2007 | Sheppard et al. |
| 2007/0241427 A1 | 10/2007 | Mochizuki et al. |
| 2007/0262324 A1 | 11/2007 | Kaneko |
| 2008/0001158 A1 | 1/2008 | Das et al. |
| 2008/0006848 A1 | 1/2008 | Chen et al. |
| 2008/0029838 A1 | 2/2008 | Zhang et al. |
| 2008/0048258 A1 | 2/2008 | de Fresart et al. |
| 2008/0105949 A1 | 5/2008 | Zhang et al. |
| 2008/0191304 A1 | 8/2008 | Zhang et al. |
| 2008/0224316 A1* | 9/2008 | Kroeninger et al. ......... 257/751 |
| 2008/0230787 A1 | 9/2008 | Suzuki et al. |
| 2008/0251793 A1 | 10/2008 | Mazzola et al. |
| 2008/0258252 A1 | 10/2008 | Shimizu et al. |
| 2008/0277669 A1 | 11/2008 | Okuno et al. |
| 2008/0296771 A1 | 12/2008 | Das et al. |
| 2009/0008709 A1 | 1/2009 | Yedinak et al. |
| 2009/0039498 A1* | 2/2009 | Bayerer ........................ 257/700 |
| 2009/0095979 A1 | 4/2009 | Saito et al. |
| 2009/0101918 A1 | 4/2009 | Uchida et al. |
| 2009/0121319 A1 | 5/2009 | Zhang et al. |
| 2009/0146154 A1 | 6/2009 | Zhang et al. |
| 2009/0168471 A1 | 7/2009 | Tsugawa et al. |
| 2009/0212301 A1 | 8/2009 | Zhang et al. |
| 2009/0225578 A1 | 9/2009 | Kitabatake |
| 2009/0272982 A1 | 11/2009 | Nakamura et al. |
| 2009/0289262 A1 | 11/2009 | Zhang et al. |
| 2010/0032685 A1 | 2/2010 | Zhang et al. |
| 2010/0133549 A1 | 6/2010 | Zhang et al. |
| 2010/0133550 A1 | 6/2010 | Zhang et al. |
| 2010/0140628 A1* | 6/2010 | Zhang ................ H01L 29/0834 257/77 |
| 2010/0163888 A1 | 7/2010 | Saggio et al. |
| 2010/0244047 A1 | 9/2010 | Hull et al. |
| 2010/0295062 A1* | 11/2010 | Uchida et al. ................ 257/77 |
| 2011/0012132 A1 | 1/2011 | Otsuka et al. |
| 2011/0018004 A1 | 1/2011 | Shimizu et al. |
| 2011/0018040 A1 | 1/2011 | Smith et al. |
| 2011/0058293 A1 | 3/2011 | Pardoen et al. |
| 2011/0101375 A1 | 5/2011 | Zhang |
| 2011/0193412 A1* | 8/2011 | Lacarnoy ........................ 307/75 |
| 2011/0199792 A1* | 8/2011 | Friebe et al. .................... 363/17 |
| 2011/0246794 A1* | 10/2011 | Liao ........................ G06F 1/263 713/300 |
| 2011/0292617 A1* | 12/2011 | Darroman et al. ............ 361/728 |
| 2012/0025263 A1 | 2/2012 | Yamaguchi |
| 2012/0044720 A1* | 2/2012 | Shea et al. .................... 363/21.1 |
| 2013/0001703 A1* | 1/2013 | Sugawara ............ H01L 29/0661 257/378 |
| 2013/0248883 A1 | 9/2013 | Das et al. |
| 2013/0307500 A1 | 11/2013 | Nojiri et al. |

FOREIGN PATENT DOCUMENTS

| | | |
|---|---|---|
| DE | 19832329 A1 | 2/1999 |
| DE | 19900171 A1 | 7/1999 |
| DE | 10036208 A1 | 2/2002 |
| EP | 0176778 A2 | 4/1986 |
| EP | 0372412 A1 | 6/1990 |
| EP | 0389863 A1 | 10/1990 |
| EP | 0637069 A1 | 2/1995 |
| EP | 0735591 A1 | 10/1996 |
| EP | 0837508 A2 | 4/1998 |
| EP | 0865085 A1 | 9/1998 |
| EP | 1058317 A2 | 12/2000 |
| EP | 1361614 A1 | 11/2003 |
| EP | 1460681 A2 | 9/2004 |
| EP | 1503425 A2 | 2/2005 |
| EP | 1693896 A1 | 8/2006 |
| EP | 1806787 A1 | 7/2007 |

(56) References Cited

FOREIGN PATENT DOCUMENTS

| | | | |
|---|---|---|---|
| EP | 1845561 A2 | 10/2007 | |
| EP | 2015364 A2 | 1/2009 | |
| EP | 2124257 A1 | 11/2009 | |
| EP | 2432014 A1 | 3/2012 | |
| JP | 60240158 A | 11/1985 | |
| JP | 1117363 A | 5/1989 | |
| JP | 03034466 A | 2/1991 | |
| JP | 03157974 A | 7/1991 | |
| JP | 3225870 A | 10/1991 | |
| JP | 08264766 A | 10/1996 | |
| JP | H08340103 A | 12/1996 | |
| JP | 09205202 A | 8/1997 | |
| JP | 11191559 A | 7/1999 | |
| JP | 11238742 A | 8/1999 | |
| JP | 11261061 A | 9/1999 | |
| JP | 11266017 A | 9/1999 | |
| JP | 11274487 A | 10/1999 | |
| JP | 2000049167 A | 2/2000 | |
| JP | 2000082812 A | 3/2000 | |
| JP | 2000106371 A | 4/2000 | |
| JP | 2000252461 A | 9/2000 | |
| JP | 2000252478 A | 9/2000 | |
| JP | 2002314099 A | 10/2002 | |
| JP | 2004363328 A | 12/2004 | |
| JP | 2007258742 A | 10/2007 | |
| JP | 2008277400 A | 11/2008 | |
| JP | 2009003111 A * | 7/2009 | ............ H01L 29/78 |
| JP | 2010010505 A | 1/2010 | |
| JP | 2010183840 A | 8/2010 | |
| JP | 2011030424 A | 2/2011 | |
| JP | 2012156548 A | 8/2012 | |
| WO | 9603774 A1 | 2/1996 | |
| WO | 9708754 A2 | 3/1997 | |
| WO | 9717730 A1 | 5/1997 | |
| WO | 9739485 A1 | 10/1997 | |
| WO | 9802916 A1 | 1/1998 | |
| WO | 9802924 A2 | 1/1998 | |
| WO | 9808259 A1 | 2/1998 | |
| WO | 9832178 A1 | 7/1998 | |
| WO | 9963591 A1 | 12/1999 | |
| WO | 0013236 A2 | 3/2000 | |
| WO | 0178134 A1 | 10/2001 | |
| WO | 2004020706 A1 | 3/2004 | |
| WO | 2004079789 A2 | 9/2004 | |
| WO | 2005020308 A1 | 3/2005 | |
| WO | 2006135031 A2 | 12/2006 | |
| WO | 2007040710 A1 | 4/2007 | |
| WO | 2009128382 A1 | 10/2009 | |
| WO | 2010004715 A1 | 1/2010 | |
| WO | 2010074275 A1 | 7/2010 | |
| WO | 2013036370 A1 | 3/2013 | |

OTHER PUBLICATIONS

Agarwal, A.K. et al., "700-V Assymetrical 4H-SiC Gate Turn-Off Thyristors (GTO's)," IEEE Electron Device Letters, vol. 18, No. 11, Nov. 1997, pp. 518-520.
Author Unknown, "Definition of Overlap," The American Heritage Dictionary of the English Language, Fourth Edition, 2003, 3 pages, http://www.thefreedictionary.com/overlap.
Chang, H.R. et al., "500-V n-Channel Insulated-Gate Bipolar Transistor with a Trench Gate Structure," IEEE Transactions on Electron Devices, vol. 36, No. 9, Sep. 1989, pp. 1824-1829.
Miura, Naruhisa et al., "Successful Development of 1.2 kV 4H-SiC MOSFETs with the Very Low On-Resistance of 5 mΩm2," Proceedings of the 18th International Symposium on Power Semiconductor Devices & IC's, Jun. 4-8, 2006, 4 pages, Naples Italy.
Richmond, J.T. et al., "Hybrid 4H-SiC MOS Gated Transistor (MGT)", DARPA Contract #N00014-99-C-0377, 2002, 6 pages.
Salem, T.E. et al., "High-Temperature High-Power Operation of a 100 A SiC DMOSFET Module," Twenty-Fourth Annual IEEE Applied Power Electronics Conference and Exposition, Copyright: 2009, pp. 653-657.
Shenoy, Jayarama N. et al., "High-Voltage Double-Implanted Power MOSFET's in 6H-SiC", IEEE Electron Device Letters, Mar. 1997, vol. 18, No. 3, pp. 93-95.
Tamaki, Tomohiro et al., "Optimization of ON-State and Switching Performances for 15-20-kV 4H-SiC IGBTs," IEEE Transactions on Electron Devices, vol. 55, No. 8, Aug. 2008, pp. 1920-1927.
Tan, J. et al., "High-Voltage Accumulation-Layer UMOSFET's in 4H-SiC", IEEE Electron Device Letters, Sep. 1998, vol. 49, No. 12, pp. 487-489.
Tone, Kiyoshi et al., "4H-SiC Normally-Off Vertical Junction Field-Effect Transistor With High Current Density," IEEE Electron Device Letters, vol. 24, No. 7, Jul. 2003, pp. 463-465.
Non-Final Office Action for U.S. Appl. No. 13/108,440, mailed Aug. 2, 2012, 23 pages.
Non-Final Office Action for U.S. Appl. No. 13/102,510, mailed Aug. 2, 2012, 32 pages.
Final Office Action for U.S. Appl. No. 13/108,440, mailed Jan. 17, 2013, 36 pages.
Final Office Action for U.S. Appl. No. 13/102,510, mailed Feb. 12, 2013, 27 pages.
Advisory Action for U.S. Appl. No. 13/108,440, mailed Mar. 25, 2013, 4 pages.
Advisory Action for U.S. Appl. No. 13/102,510, mailed Apr. 19, 2013, 3 pages.
Non-Final Office Action for U.S. Appl. No. 13/102,510, mailed Jun. 20, 2013, 28 pages.
Casady, J.B. et al., "900 V DMOS and 1100 V UMOS 4H-SiC Power FETs", Northrop Grumman Science and Technology Center, 1997, 2 Pages.
Agarwal et al., "9kV, 1x33 cm SiC Super GTO technology development for pulse power," Pulsed Power Conference, 2009, presented Jun. 28-Jul. 2, 2009, pp. 264-269.
International Search Report and Written Opinion for PCT/US2012/27255 mailed Jun. 13, 2012, 10 pages.
"Insulated-gate bipolar transistor," Wikipedia, accessed Jun. 21, 2010, 6 pages.
Agarwal et al., " 1400 V 4H-SiC power MOSFETs," Materials Science Forum, vol. 264-268, 1998, presented Sep. 1997, pp. 989-992.
Agarwal et al., "1.1 kV 4H-SiC power UMOSFET's," Electron Device Letters, vol. 18, No. 12, Dec. 1997, pp. 586-588.
Agarwal et al., "Investigation of lateral RESURF, 6H-SiC MOSFETs," Materials Science Forum, vol. 338-342, 2000, presented Oct. 10-15, 1999, pp. 1307-1310.
Agarwal et al., "Temperature dependence of Fowler-Nordheim current in 6H-and 4H-SiC MOS capacitors," Electron Device Letters, vol. 18, No. 12, Dec. 1997, pp. 592-594.
Suvorov, A.V. et al., "4H-SiC self-aligned implant-diffused structure for power DMOSFETs," Materials Science Forum, vol. 338-342, 2000, presented Oct. 10-15, 1999, pp. 1275-1278.
Agarwal et al., "A critical look at the performance advantages and limitations of 4H-SiC power UMOSFET structures," IEEE International Symposium on Power Semiconductor Devices and ICs, May 20-23, 1996, pp. 119-122.
Asano et al., "Dynamic characteristics of 6.2kV high voltage 4H-SiC pn diode with low loss," Transactions of the Institute of Electrical Engineers of Japan, Part D Inst. Electr. Eng. Japan, vol. 123D, No. 5, May 2003, pp. 623-627.
Ayalew, T., "Dissertations of Tesfaye Ayalew," Section 4.4.3.1 MPS Diode Structure, SiC Semiconductor Devices Technology, Modeling, and Simulation, Jan. 2004, 2 pages.
Baliga, "Insulated gate bipolar transistor," Power Semiconductor Devices (book), PWS Publishing Company, Boston, MA, 1996, pp. 426-502.
Baliga, "Power MOSFET," Power Semiconductor Devices (book), PWS Publishing Company, Boston, MA, 1996, pp. 335-425.
International Search Report and Written Opinion corresponding to International Application No. PCT/US2008/010538, mailed Dec. 22, 2008, 13 pages.
Bhatnagar et al., "Comparison of 6H-SiC, 3C-SiC, and Si for power devices," Transactions on Electron Devices, vol. 40, No. 3, Mar. 1993, pp. 645-655.

(56) References Cited

OTHER PUBLICATIONS

Buchner et al., "Laser recrystallization of polysilicon for improved device quality," Springer Proceedings in Physics, vol. 35, 1989, presented Aug. 29-Sep. 2, 1988, pp. 289-294.

Capano, M.A. et al., "Ionization energies and electron mobilities in phosphorus- and nitrogen-implanted 4H-silicon carbide," IEEE ICSCRM Conference, Research Triangle Park, NC, Oct. 10-13, 1999, 4 pages.

Chakraborty et al., "Interface properties of N2O-annealed SiO2/SiC system," IEEE Hong Kong Electron Devices Meeting, Jun. 24, 2000, pp. 108-111.

Chang et al., "Observation of a non-stoichiometric layer at the silicon dioxide-silicon carbide interface: effect of oxidation temperature and post-oxidation processing conditions," Materials Research Society Symposium Proceedings, vol. 640, 2001, presented at 2000 MRS Fall Meeting, 6 pages.

Chen et al. "Theoretical Analysis of Current Crowding Effect in Metal/AlGaN/GaN Schottky Diodes and Its Reduction by Using Polysilicon in Anode," Chin. Phys. Lett., vol. 24, No. 7, Jun. 25, 2007, pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC metal-oxide-semiconductor capacitors," Applied Physics Letters. vol. 77, No. 8, Aug. 21, 2000, pp. 1215-1217.

Chung et al. "Effects of anneals in ammonia on the interface trap density near the band edges in 4H-silicon carbide metal-oxide-semiconductor capacitors," Applied Physics Letters. vol. 77, No. 22, Nov. 27, 2000, pp. 3601-3603.

Chung et al., "The Effect of Si:C Source Ratio on SiO2/SiC Interface State Density for Nitrogen Doped 4H and 6H-SiC," Materials Science Forum, 2000, presented Oct. 10-15, 1999, vols. 338-342, pp. 1097-1100.

International Search Report and Written Opinion for corresponding International Application No. PCT/US2004/004982, dated Jul. 22, 2004, 28 pages.

International Search Report for PCT/US01/30715, mailed Jun. 5, 2002, 9 pages.

International Search Report for PCT/US01/42414, mailed Apr. 23, 2002, 10 pages.

International Search Report for PCT/US02/11691 mailed Dec. 17, 2002, 9 pages.

Alok, D. et al., "Process Dependence of Inversion Layer Mobility in 4HSiC Devices," Materials Science Forum, vols. 338-342, 2000, presented Oct. 10-15, 1999, pp. 1077-1080.

Dahlquist et al. "A 2.8kV, Forward Drop JBS Diode with Low Leakage," Materials Science Forum, vols. 338-342, 2000, presented Oct. 10-15, 1999, pp. 1179-1182.

Das, "Fundamental Studies of the Silicon Carbide MOS Structure," Thesis, Purdue University, Dec. 1999, 150 pages.

Dastidar, "A Study of P-Type Activation in Silicon Carbide," Thesis, Purdue University, May 1998, 92 pages.

Demeo et al., "Thermal Oxidation of SiC in N2O", J. Electrochem. Soc., vol. 141, No. 11, Nov. 1994, pp. L 150-L 152.

Del Prado et al., "Full Composition Range Silicon Oxynitride Films Deposited by ECR-PECVD at Room Temperatures," Thin Solid Films, vol. 343-344, Apr. 1999, p. 437-440.

Dimitrijev et al., "Nitridation of Silicon-Dioxide Films Grown on 6H Silicon Carbide", IEEE Electronic Device Letters, vol. 18, No. 5, May 5, 1997, pp. 175-177.

Extended European Search Report for application No. 09177558.5 mailed Feb. 22, 2010, 6 pages.

Extended European Search Report for application No. 09163424.6 mailed Apr. 9, 2010, 10 pages.

Extended European Search Report for application No. 07120038.0 mailed Jun. 16, 2008, 7 pages.

Extended European Search Report corresponding to European Application No. 07112298.0 mailed Feb. 18, 2009, 12 pages.

Fisher, C.A. et al., "The performance of high-voltage field relieved Schottky barrier diodes", IEEE Proceedings Section A, vol. 132, Pt. I, No. 6, Dec. 1985, pp. 257-260.

Fukuda et al., "Improvement of SiO2/4H-SiC Interface Using High-Temperature Hydrogen Annealing at Low Pressure and Vacuum Annealing," Japan Society of Applied Physics, vol. 38, Apr. 1999, pp. 2306-2309.

Fukuda et al. "Improvement of SiO2/4H-SiC Interface by Using High Temperature Hydrogen Annealing at 1000° C.," Extended Abstracts of the International Conference on Solid State Devices and Materials. Japan Society of Applied Physics, Tokyo, Japan, Sep. 1998, pp. 100-101.

Chung, G.Y. et al., "Effect of nitric oxide annealing on the interface trap densities near the band edges in the 4H polytype of silicon carbide," Applied Physics Letters, vol. 76, No. 13, Mar. 27, 2000, pp. 1713-1715.

Chung, G.Y. et al., "Improved Inversion Channel Mobility for 4H-SiC MOSETs Following High Temperature Anneals in Nitric Oxide," IEEE Electron Device Letters, vol. 22, No. 4, Apr. 2001, pp. 176-178.

Li, H.F. et al., "Improving SiO2 Grown on P-Type 4H-SiC by NO Annealing," Materials Science Forum, vols. 264-268, 1998, presented Sep. 1997, pp. 869-872.

"The Insulated Gate Bipolar Transistor (IGBT)," Device Modelling Group, University of Glasgow School of Engineering, http://www.elec.gla.ac.uk, Feb. 14, 2007, 3 pages.

Hubel, K., "Hybrid design improves diode robustness and boosts efficiency," Compoundsemiconductor.net, May 24, 2006, 8 pages.

Hull et al., "Drift-Free 10-kV, 20-A 4H-SiC PiN Diodes," Journal of Electronic Materials, vol. 34, No. 4, Apr. 2005, pp. 341-344.

International Preliminary Report on Patentability corresponding to International Application No. PCT/US2007/010192, mailed Sep. 23, 2008, 9 pages.

International Search Report and Written Opinion corresponding to International Application No. PCT/US2010/020071 mailed Mar. 26, 2010, 14 pages.

International Search Report and Written Opinion corresponding to International Application No. PCTUS2009/065251 mailed Jun. 1, 2010, 14 pages.

Jamet, et al. "Physical properties of N2O and NO-nitrided gate oxides grown on 4H SiC," Applied Physics Letters. vol. 79, No. 3, Jul. 16, 2001, pp. 323-325.

Ueno, K. et al., "Counter-Doped MOSFET's of 4H-SiC," IEEE Electron Device Letters, vol. 20, No. 12, Dec. 1999, pp. 624-626.

Ueno, K. et al., "4H-SiC MOSFET's Utilizing the H2 Surface Cleaning Technique," IEEE Electron Device Letters, vol. 19, No. 7, Jul. 1998, pp. 244-246.

Ueno, K. et al., "The Guard-Ring Termination for the High-Voltage SiC Schottky Barrier Diodes," IEEE Electron Device Letters. vol. 16. No. 7, Jul. 1995, pp. 331-332.

Kinoshita et al., "Guard Ring Assisted RESURF: A New Termination Structure Providing Stable and High Breakdown Voltage for SiC Power Devices," Technical Digest of ISPSD '02, vol. 14, 2002, presented Jun. 4-7, 2002, pp. 253-256.

Kobayashi et al. "Dielectric Breakdown and Current Conduction of Oxide/Nitride/Oxide Multi-Layer Structures," 1990 IEEE Symposium on VLSI Technology, presented Jun. 4-7, 1990, pp. 119-120.

Krishnaswami et al., "High Temperature characterization of 4H-SiC bipolar junction transistors", Materials Science Forum, Aedermannsfdorf, Switzerland, vol. 527-529, Jan. 1, 2006, pp. 1437-1440.

Lipkin, L.A. et al., "Low interface state density oxides on p-type SiC," Materials Science Forum, vols. 264-268, 1998, presented Sep. 1997, pp. 853-856.

Lai et al., "Interface Properties of N2O-Annealed NH3-Treated 6H-SiC MOS Capacitor," IEEE Hong Kong Electron Devices Meeting, Jun. 26, 1999, pp. 46-49.

Leonhard et al. "Long term stability of gate-oxides on n- and p-type silicon carbide studied by charge injection techniques," Materials Science Engineering, vol. 46, No. 1-3, Apr. 1997, pp. 263-266.

Levinshtein et al., "On the homogeneity of the turn-on process in high voltage 4H-SiC thyristors", Solid-State Electronics, vol. 49, No. 2, Feb. 1, 2005, pp. 233-237.

(56) References Cited

OTHER PUBLICATIONS

Lipkin et al. "Insulator Investigation on SiC for Improved Reliability," IEEE Transactions on Electron Devices. vol. 46, No. 3, Mar. 1999, pp. 525-532.
Lipkin et al. "Challenges and State-of-the-Art of Oxides on SiC," Materials Research Society Symposium Proceedings, vol. 640, 2001, presented Nov. 2000, 10 pages.
Losee et al., "Degraded Blocking Performance of 4H-SiC Rectifiers Under High dV/dt Conditions," Proceedings of 17th International Symposium on Power Semiconductor Devices & ICs, May 23-26, 2005, 4 pages.
Losee et al., "High-Voltage 4H-SiC PiN Rectifiers with Single-Implant, Multi-Zone JTE Termination", Power Semiconductor Devices and ICs, 2004 Proceedings. ISPSB '04, May 24-27, 2004, pp. 301-304.
Das, M. M et al., "A 13 kV 4H-SiC N-Channel IGBT with Low Rdiff,on and Fast Switching," International Conference on Silicon Carbide and Related Materials (ICSCRM), Otsu, Japan, Oct. 14-19, 2007, 4 pages.
Das, M. et al., "High Mobility 4H-SiC Inversion Mode MOSFETs Using Thermally Grown, NO Annealed Si02," IEEE Device Research Conference, Denver, Colorado, Jun. 19-21, 2000, 3 pages.
Capano, M.A. et al., "Surface Roughening in Ion Implanted 4H-Silicon Carbide," Journal of Electronic Materials, vol. 28, No. 3, pp. 214-218, Mar. 1999, pp. 214-218.
Das, M. et al., "Inversion Channel Mobility in 4H- and 6H-SiC MOSFETs," IEEE Semiconductor Interface Specialists Conference, San Diego, California, Dec. 3-5, 1998, 2 pages.
Ma et al., "Fixed and trapped charges at oxide-nitride-oxide heterostructure interfaces formed by remote plasma enhanced chemical vapor deposition," Journal of Vacuum Science and Technology B, vol. 11, No. 4, Jul./Aug. 1993, pp. 1533-1540.
Mondal et al., "An Integrated 500-V Power DSMOSFET/Antiparallel Rectifier Device with Improved Diode Reverse Recovery Characteristics," IEEE Electron Device Letters, vol. 23, No. 9, Sep. 2002, pp. 562-564.
Motorola, "Power MOSFET Transistor Data," 4th edition, Motorola, Inc., 1989, 6 pages.
Mutin, P., "Control of the Composition and Structure of Silicon Oxycarbide and Oxynitride Glasses Derived from Polysiloxane Precursors," Journal of Sol-Gel Science and Technology, vol. 14, No. 1, Mar. 1999, pp. 27-38.
Myer-Ward et al., "Turning of Basal Plane Dislocations During Epitaxial Growth on 4 degree off-axis 4h-SiC," European Conference on Silicon Carbide and Related Materials, Barcelona, Spain, Sep. 7-11, 2008, 4 pages.
International Search Report and the Written Opinion for PCT/US2010/026632 mailed Oct. 8, 2010, 16 pages.
International Search Report and the Written Opinion for PCT/US2010/035713 mailed Jul. 27, 2010, 14 pages.
International Search Report and the Written Opinion for PCT/US2010/042075 mailed Sep. 24, 2010, 15 pages.
International Search Report and the Written Opinion for PCT/US2010/028612 mailed Jun. 17, 2010, 10 pages.
International Search Report and the Written Opinion for PCT/US2008/004239, mailed Mar. 2, 2009, 14 pages.
Tobin, P.J. et al., "Furnace formation of silicon oxynitride thin dielectrics in nitrous oxide (N20): the role of nitric oxide (NO)," Journal of Applied Physics, vol. 75, No. 3, Feb. 1, 1994, pp. 1811-1817.
Shenoy, P.M. et al., "The Planar 6H-SiC ACCUFET: A New High-Voltage Power MOSFET Structure," IEEE Electron Device Letters, vol. 18, No. 12, Dec. 1997, pp. 589-591.
Lai, P.T. et al., "Effects of nitridation and annealing on interface properties of thermally oxidized Si02/SiC metal-oxide-semiconductor system," Applied Physics Letters, vol. 76, No. 25, Jun. 2000, pp. 3744-3746.
Palmour et al., "SiC Device Technology: Remaining Issues," Diamond and Related Materials, vol. 6, No. 10, Aug. 1997, pp. 1400-1404.
Palmour, "Silicon Carbide npnp Thyristors," NASA Technical Briefs—Electronics and Computers, Dec. 1, 2000, John H. Glenn Research Center, Cleveland, Ohio (US), http://www.Techbriefs.com/comgonenUcontenUarticle/7031-lew-16750?tmgl=comgonent &grint=1&gage= retrieved on Feb. 10, 2010).
Panknin et al., "Electrical and microstructural properties of highly boron-implantation doped 6H-SiC", Journal of Applied Physics, vol. 89 No. 6, Mar. 15, 2001, pp. 3162-3167.
Pantelides et al., "Atomic-Scale Engineering of the SiC-Si02 Interface," Materials Science Forum, vols. 338-342, 2000, presented Oct. 10-15, 1999, pp. 1133-1136.
Patel, R., et al., "Phosphorus-Implanted High-Voltage N + P 4H-SiC Junction Rectifiers," 1998 International Symposium on Power Semiconductor Devices & ICs, Jun. 3-6, 1998, pp. 387-390.
Zhang, Q. et al., "12 kV 4H-SiC p-IGBTs with Record Low Specific On-Resistance" presented at: International Conference on Silicon Carbide and Related Materials (ICSCRM), Otsu, Japan, Oct. 14-19, 2007, 4 pages.
Schorner, R. et al., "Significantly Improved Performance of MOSFETs on Silicon Carbide Using the 15R-SiC Polytype," IEEE Electron Device Letters, vol. 20, No. 5, May 1999, pp. 241-244.
Schorner, R. et al., "Rugged Power MOSFETs in 6H-SiC with Blocking Capability up to 1800 V," Materials Science Forum, vols. 338-342, 2000, presented Oct. 10-15, 1999, pp. 1295-1298.
Singh, R. et al., "High Temperature, High Current, 4HSiC Accu-DMOSFET," Materials Science Forum, vols. 338-342, 2000, presented Oct. 10-15, 1999, pp. 1271-1274.
Rao et al., "Al and N Ion Implantations in 6H-SiC," Silicon Carbide and Related Materials, 1996, presented in 1995, Kyoto, Japan, pp. 521-524.
Rao et al. "P-N Junction Formation in 6H-SiC by Acceptor Implantation into N-Type Substrate," Nuclear Instruments and Methods in Physics Research B., vol. 106, Dec. 2, 1995, pp. 333-338.
Rao et al. "Silane overpressure post-implant annealing of Al dopants in SiC: Cold wall CVD apparatus", Applied Surface Science, vol. 252, No. 10, Mar. 15, 2006, pp. 3837-3842.
Rao, "Maturing ion-implantation technology and its device applications in SiC", Solid State Electronics, vol. 47, No. 2, Feb. 2003, pp. 213-222.
Ryu et al., "27 mQ-cm2, 1.6 kV Power DiMOSFETs in 4H-SiC," 14 International Symposium on Power Semiconductor Devices & ICs 2002, Jun. 4-7, 2002, Santa Fe, New Mexico, 22 pages.
Sridevan, S. et al., "Lateral N-Channel Inversion Mode 4H-SiC MOSFET's," IEEE Electron Device Letters, vol. 19, No. 7, Jul. 1998, pp. 228-230.
Sridevan, S. et al., "On the Presence of Aluminum in Thermally Grown Oxides on 6H-Silicon Carbide," IEEE Electron Device Letters, vol. 17, No. 3, Mar. 1996, pp. 136-138.
Sze, Semiconductor Devices: Physics and Technology (book), 2nd Edition, John Wiley and Sons, 2002, pp. 130.
Pantelides, "Atomic Scale Engineering of SiC Dielectric Interfaces," DARPA/MTO High Power and ONR Power Switching MURI Reviews, Rosslyn, VA, Aug. 10-12, 1999, 20 pages.
Senzaki et al., "Effects of Pyrogenic Reoxidation Annealing on Inversion Channel Mobility of 4H-SiC Metal-Oxide-Semiconductor Field-Effect Transistor Fabricated on (1120) Face," Japanese Journal of Applied Physics, Japan Society of Applied Physics, vol. 40, No. 11 B, Part 2, Nov. 2001, pp. L 1201-L 1203.
Singh et al., "Planar Terminations in 4H-SiC Schottky Diodes with Low Leakage and High Yields," IEEE International Symposium on Power Semiconductor Devices and ICs, 1997, presented May 26-29, 1997, pp. 157-160.
Stengl et al., "Variation of lateral doping—a new concept to avoid high voltage breakdown of planar junctions," International Electron Devices Meeting, Washington, DC, Dec. 1-4, 1985, pp. 154-157.
Stengl et al., "Variation of Lateral Doping as a Field Terminator for High-Voltage Power Devices," IEEE Transactions on Electron Devices, vol. ED-33, No. 3, Mar. 1986, pp. 426-428, XP000836911.
Streetman, "Bipolar Junction Transistors," Solid State Electronic Devices (book), Prentice Hall, Englewood Cliffs, NJ., 1980, pp. 228-284.

(56) References Cited

OTHER PUBLICATIONS

Sugawara et al., "3.6 kV 4H-SiC JBS Diodes with Low RonS," Materials Science Forum, vols. 338-342, No. 2, 2000, presented Oct. 10-15, 1999, pp. 1183-1186, XP-000944901.
Sundaresan et al., "Ultra-low resistivity Al+ implanted 4H-SiC obtained by microwave annealing and a protective graphite cap," Solid-State Electronics, vol. 52, No. 1, Jan. 2008, pp. 140-145.
Suzuki et al., "Effect of Post-oxidation-annealing in Hydrogen on Si02/4H-SiC Interface," Materials Science Forum, vols. 338-342, 2000, presented Oct. 10-15, 1999, pp. 1073-1076.
Sze, S.M., Physics of Semiconductor Devices (book), John Wiley & Sons, 1981, pp. 383-390.
Thomas et al., "Annealing of Ion Implantation Damage in SiC Using a Graphite Mask," Material Research Society Symposium Proceedings, San Francisco, California, vol. 572, Apr. 5-8, 1999, pp. 45-50.
Treu et al., "A Surge Current Stable and Avalanche Rugged SiC Merged pn Schottky Diode Blocking 600V Especially Suited for PFC Applications," Materials Science Forum, vols. 527-529, 2005, presented Sep. 18-23, 2005, pp. 1155-1158.
Vathulya, V.R. et al., "Characterization of Channel Mobility on Implanted SiC to Determine Polytype Suitability for the Power DIMOS Structure," Electronic Materials Conference, Santa Barbara, CA, Jun. 30-Jul. 2, 1999, 13 pages.
Vathulya, V.R. et al., "A Novel 6H-SiC Power DMOSFET with Implanted P-Well Spacer," IEEE Electronic Device Letters, vol. 20, No. 7, Jul. 1999, pp. 354-356.
Afanasev, V.V. et al., "Intrinsic SiC/Si02 Interface States," Physica Status Solidi (a), vol. 162, Jul. 1997, pp. 321-337.
Vassilevski et al., "Protection of selectively implanted and patterned silicon carbide surfaces with graphite capping layer during post-implantation annealing," Institute of Physics Publishing, Semiconductor Science and Technology, vol. 20, No. 3, Mar. 2005, pp. 271-278.
Vassilevski et al., "High Voltage Silicon Carbide Schottky Diodes with Single Zone Junction Termination Extension," Materials Science Forum, vols. 556-557, 2007, presented Sep. 3-7, 2007, pp. 873-876.
Wang et al., "High Temperature Characteristics of High-Quality SiC MIS Capacitors with 0/N/0 Gate Dielectric," IEEE Transactions on Electron Devices, vol. 47, No. 2, Feb. 2000, pp. 458-462.
Williams et al., "Passivation of the 4H-SiC/Si02 Interface with Nitric Oxide," Materials Science Forum, vols. 389-393, 2002, presented Fall 2001, Tsukuba, Japan, pp. 967-72.
Xu et al., "Improved Performance and Reliability of N20-Grown Oxynitride on 6H-SiH," IEEE Electron Device Letters, vol. 21, No. 6, Jun. 2000, pp. 298-300.
Li et al., "High Voltage (3 kV) UMOSFETs in 4H-SiC," Transactions on Electron Devices, vol. 49, No. 6, Jun. 2002, pp. 972-975.
Wang et al., "Accumulation-Mode SiC Power MOSFET Design Issues," Materials Science Forum, vols. 338-342, 2000, presented Oct. 10-15, 1999, pp. 1287-1290.
Yilmaz, "Optimization and Surface Charge Sensitivity of High Voltage Blocking Structures with Shallow Junctions," IEEE Transactions on Electron Devices, vol. 38, No. 3, Jul. 1991, pp. 1666-1675.
Zhang et al., "Design and Fabrication of High Voltage IGBTs on 4H-SiC", 2006 IEEE International Symposium on Power Semiconductor Devices and ICs, Naples, Italy, Jun. 4-8, 2006, 1-4 pages.
Zhang et al., "A 10-kV Monolithic Darlington Transistor with βforced of 336 in 4H-SiC," IEEE Electron Device Letters, vol. 30, No. 2, Feb. 2009, pp. 142-144.
International Search Report and Written Opinion for PCT/US2012/051429 mailed Nov. 22, 2012, 15 pages.
Baliga, Power Semiconductor Devices (book), Chapter 7, PWS Publishing, Boston, MA, 1996, 93 pages.
International Preliminary Report on Patentability for International Application No. PCT/US2012/051429, mailed Mar. 20, 2014, 9 pages.

International Search Report and Written Opinion for PCT/US2014/037977, mailed Sep. 15, 2014, 11 pages.
Hull, Brett A. et al., "Performance of 60 A, 1200 V 4H-Sic DMOSFETs," Materials Science Forum, vol. 615-617, 2009, Trans Tech Publications, pp. 749-752.
Final Office Action for U.S. Appl. No. 13/893,998, mailed May 19, 2015, 11 pages.
Non-Final Office Action for U.S. Appl. No. 14/277,820, mailed Jun. 16, 2015, 13 pages.
Kazuhiro, I. et al., "Simultaneous Formation of Ni/Al Ohmic Contacts to Both n- and p-Type 4H-SiC," Journal of Electronic Materials, vol. 37, No. 11, 2008, TMS, pp. 1674-1680.
Extended European Search Report for European Patent Application No. 12782360.7, mailed Oct. 7, 2014, 7 pages.
Office Action for Japanese Patent Application No. 2014-509288, mailed Nov. 25, 2014, 10 pages.
International Preliminary Report on Patentability for PCT/US2012/027255, mailed Nov. 21, 2013, 7 pages.
Final Office Action for U.S. Appl. No. 13/102,510, mailed Nov. 29, 2013, 22 pages.
Advisory Action for U.S. Appl. No. 13/102,510, mailed Feb. 6, 2014, 3 pages.
Non-Final Office Action for U.S. Appl. No. 13/102,510, mailed Mar. 13, 2014, 10 pages.
Final Office Action for U.S. Appl. No. 13/102,510, mailed Aug. 29, 2014, 9 pages.
Notice of Allowance for U.S. Appl. No. 13/102,510, mailed Jan. 12, 2015, 9 pages.
Corrected Notice of Allowability for U.S. Appl. No. 13/102,510, mailed Mar. 26, 2015, 4 pages.
Non-Final Office Action for U.S. Appl. No. 13/108,440, mailed Dec. 30, 2013, 104 pages.
Final Office Action for U.S. Appl. No. 13/108,440, mailed Jun. 24, 2014, 69 pages.
Non-Final Office Action for U.S. Appl. No. 13/108,440, mailed Jan. 14, 2015, 10 pages.
Notice of Allowance for U.S. Appl. No. 13/108,440, mailed Jun. 2, 2015, 16 pages.
Reason for Rejection for Japanese Patent Application No. 2014-529750, mailed Apr. 15, 2015, 8 pages.
Advisory Action for U.S. Appl. No. 13/893,998, mailed Jul. 29, 2015, 3 pages.
Non-Final Office Action for U.S. Appl. No. 13/893,998, mailed Jan. 2, 2015, 7 pages.
First Office Action and Search Report for Chinese Patent Application No. 201280055081.4, mailed Feb. 1, 2016, 31 pages.
Decision of Rejection for Japanese Patent Application No. 2014-529750, mailed Feb. 26, 2016, 6 pages.
International Preliminary Report on Patentability for PCT/US2014/037977, mailed Nov. 26, 2015, 8 pages.
International Search Report and Written Opinion for No. PCT/US2015/030853, mailed Nov. 5, 2015, 15 pages.
Non-Final Office Action for U.S. Appl. No. 13/893,998, mailed Jan. 4, 2016, 12 pages.
Notice of Allowance for U.S. Appl. No. 14/277,820, mailed Nov. 27, 2015, 9 pages.
Final Office Action for U.S. Appl. No. 13/893,998, mailed May 17, 2016, 12 pages.
Notice of Allowance for U.S. Appl. No. 14/277,820, mailed May 25, 2016, 6 pages.
Report of Reexamination before Appeal for Japanese Patent Application No. 2014-529750, mailed Aug. 18, 2016, 6 pages.
Advisory Action for U.S. Appl. No. 13/893,998, mailed Aug. 31, 2016, 3 pages.
Notice of Allowance for U.S. Appl. No. 13/893,998, mailed Dec. 15, 2016, 9 pages.
Second Office Action for Chinese Patent Application No. 201280055081.4, issued Nov. 8, 2016, 20 pages.
International Preliminary Report on Patentability for No. PCT/US2015/030853, mailed Nov. 24, 2016, 10 pages.

(56) References Cited

OTHER PUBLICATIONS

Berning, David W. et al., "High-Voltage Isolated Gate Drive Circuit for 10 kV, 100 A SiC MOSFET/JBS Power Modules," IEEE Industry Applications Society Annual Meeting, Oct. 5-9, 2008, IEEE, pp. 1-7.

Grider, David et al., "10kV/120 A SiC DMOSFET Half H-Bridge Power Modules for 1 MVA Solid State Power Substation," IEEE Electric Ship Technologies Symposium (ESTS), Apr. 10-13, 2011, IEEE, pp. 131-134.

Examination Report for European Patent Application No. 12762112.6, mailed Feb. 1, 2017, 4 pages.

Notice of Allowability for U.S. Appl. No. 13/893,998, mailed Jan. 10, 2017, 6 pages.

Corrected Notice of Allowability for U.S. Appl. No. 13/893,998, mailed Jan. 25, 2017, 6 pages.

Corrected Notice of Allowability for U.S. Appl. No. 13/893,998, mailed Feb. 16, 2017, 6 pages.

Corrected Notice of Allowability for U.S. Appl. No. 13/893,998, mailed Mar. 14, 2017, 6 pages.

\* cited by examiner

POWER MODULE FOR SUPPORTING HIGH CURRENT DENSITIES

CROSS REFERENCE TO RELATED APPLICATIONS

This application claims the benefit of U.S. provisional patent application No. 61/533,254 filed Sep. 11, 2011, the disclosure of which is incorporated herein by reference in its entirety. The present application is related to U.S. patent application Ser. No. 13/108,440 filed May 16, 2011, now U.S. Pat. No. 9,142,662, which is a continuation in part of U.S. patent application Ser. No. 13/102,510, filed May 6, 2011, now U.S. Pat. No. 9,029,945, the disclosures of which are incorporated herein by reference in their entireties.

FIELD OF THE DISCLOSURE

The present disclosure relates to electronic devices and in particular to power modules.

BACKGROUND

Power devices made with silicon carbide (SiC) are expected to show great advantages as compared to those on silicon for high speed, high power and/or high temperature applications due to the high critical field and wide band gap of SiC. For devices capable of blocking high voltages, such as voltages in excess of about 5 kV, it may be desirable to have bipolar operation to reduce the drift layer resistance via conductivity modulation resulting from injected minority carriers. However, one technical challenge for bipolar devices in silicon carbide is forward voltage degradation over time, possibly due to the presence of Basal Plane Dislocations (BPD) in single crystals of silicon carbide. Thus, unipolar devices such as SiC Schottky diodes and MOSFETs are typically used for high power applications, e.g., up to 10 kV or more.

SiC DMOSFET devices with a 10 kV blocking capability have been fabricated with a specific on-resistance of about 100 m$\Omega \times cm^2$. DMOSFET devices may exhibit very fast switching speeds of, for example, less than 100 ns, due to their majority carrier nature. However, as the desired blocking voltage of devices increases, for example up to 15 kV or more, the on-resistance of a MOSFET device may increase substantially, due to the corresponding increase in the drift layer thickness. This problem may be exacerbated at high temperatures due to bulk mobility reduction, which may result in excessive power dissipation.

With the progress of SiC crystal material growth, several approaches have been developed to mitigate BPD related problems. See, e.g., B. Hull, M. Das, J. Sumakeris, J. Richmond, and S. Krishinaswami, "Drift-Free 10-kV, 20-A 4H—SiC PiN Diodes", Journal of Electrical Materials, Vol. 34, No. 4, 2005, which is incorporated herein by reference in its entirety. These developments may enhance the development and/or potential applications of SiC bipolar devices such as thyristors, GTOs, etc. Even though thyristors and/or GTOs may offer low forward voltage drops, they may require bulky commutating circuits for the gate drive and protections. Accordingly, it may be desirable for a SiC bipolar device to have gate turn-off capability. Due to their superior on-state characteristics, reasonable switching speed, and/or excellent safe-operation-area (SOA), 4H—SiC insulated gate bipolar transistors (IGBTs) are becoming more suitable for power switching applications.

These devices are used in power modules, which operate to dynamically control large amounts of power through switching for motors, inverters, generators, and the like. There is a continuing need for power modules that are smaller and less expensive to manufacture while at the same time being capable of controlling larger loads.

SUMMARY

A power module is disclosed that supports high current densities. The power module includes a housing with an interior chamber wherein multiple switch modules are mounted within the interior chamber. The switch modules comprise multiple transistors and diodes that are interconnected to facilitate switching power to a load. In one embodiment, at least one of the switch modules supports a current density of at least 10 amperes per $cm^2$.

In other embodiments, at least one transistor in a switch module includes a drift layer having a first conductivity type, a well region in the drift layer having a second conductivity type opposite the first conductivity type, and a source region in the well region. The source region has the first conductivity type and defines a channel region in the well region. The source region includes a lateral source region adjacent the channel region and a plurality of source contact regions extending away from the lateral source region opposite the channel region. A body contact region having the second conductivity type is between at least two of the plurality of source contact regions and is in contact with the well region, and a source ohmic contact is in contact with the source contact regions and the body contact region.

The body contact region may include a plurality of body contact regions that are interspersed between the source contact regions. The plurality of body contact regions may be spaced apart from the channel region by the lateral source region.

The source ohmic contact may be in contact with the source region in a source contact area and the source ohmic contact may be in contact with the body contact region in a body contact region area.

In some embodiments, a ratio of a minimum dimension p1 of the contact region area to a minimum dimension w1 of the well region may be greater than 0.2. In further embodiments, the ratio of the minimum dimension p1 of the contact region area to the minimum dimension w1 of the well region may be greater than about 0.3.

The drift region may include a wide bandgap semiconductor material, such as silicon carbide.

The source region has a sheet resistance and the source ohmic contact has a sheet resistance that is greater than 75% of the contact resistance of the source region, and in some embodiments is greater than the contact resistance of the source region.

The transistor may have a reverse blocking voltage in excess of 1000 volts and a current density greater than 200 amps per square centimeter.

BRIEF DESCRIPTION OF THE DRAWINGS

The accompanying drawings, which are included to provide a further understanding of the disclosure and are incorporated in and constitute a part of this application, illustrate certain embodiment(s) of the disclosure. In the drawings.

DETAILED DESCRIPTION OF EMBODIMENTS OF THE DISCLOSURE

Figure 1:
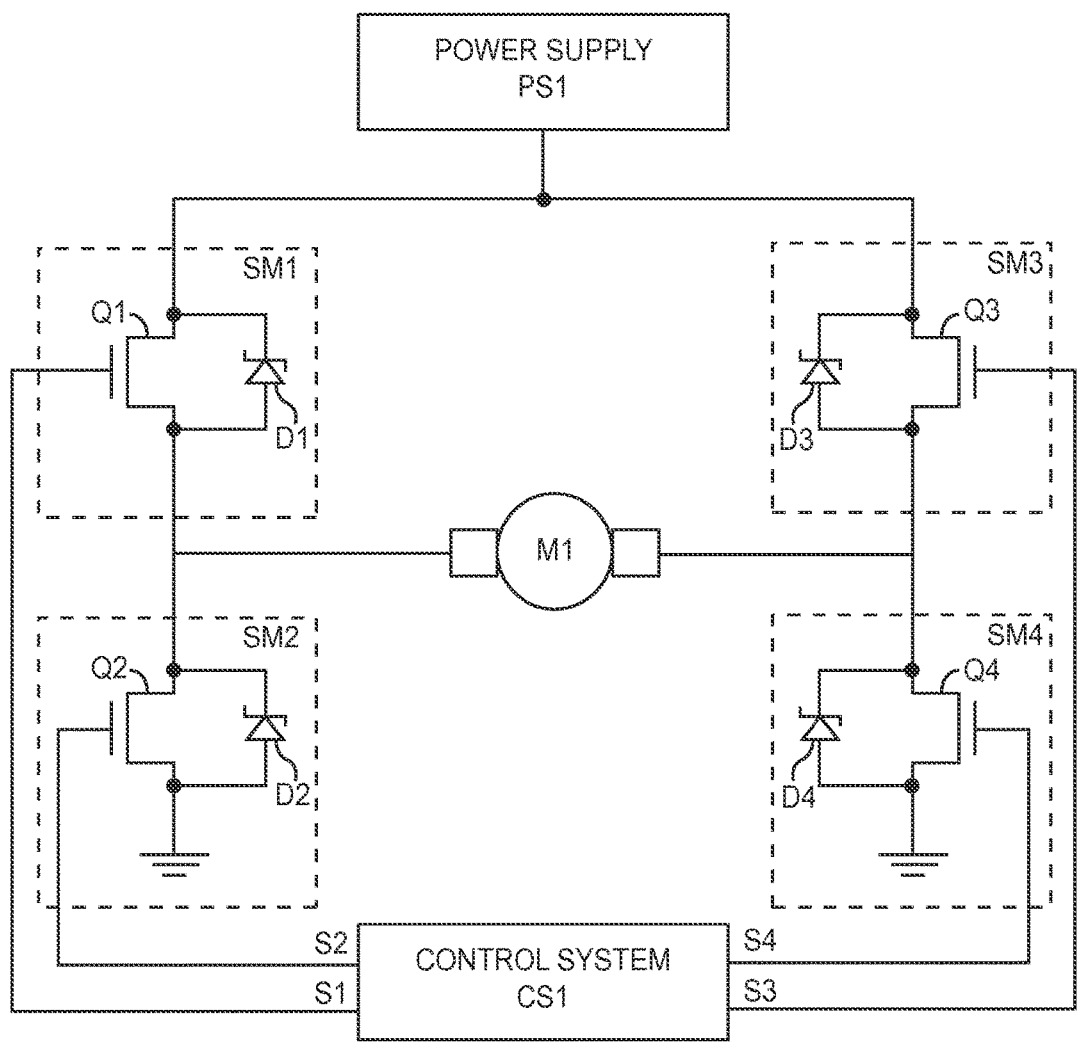
FIG. 1 is a circuit diagram of an H-bridge for an exemplary power module that is configured to drive a motor.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Some embodiments of the disclosure are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

An exemplary system that employs a power module is illustrated in FIG. 1. As depicted, the power module can include four switch modules SM1-SM4, which are controlled by a control CS1 to deliver power from a power supply PS1 to a load in a controlled manner. The switch modules SM1 and SM2 form a first half of an H-bridge, while switch modules SM3 and SM4 form a second half of the H-bridge. As noted, power modules are often used to drive an inductive load, such as that provided by a direct current (DC) motor M1. The details of the switch modules SM1-SM4 are described in further detail below.

For now, assume the switch modules SM1-SM4 can include at least one transistor in parallel with an internal or external diode that is connected in anti-parallel with the transistor. The transistors are illustrated as metal oxide field effect transistors (MOSFETs), and the diodes are illustrated as Schottky diodes for purposes of description. The MOSFETs may be replaced with other types of transistors, such as bipolar transistors, including insulated gate bipolar transistors (IGBTs), and various kinds of field effect transistors (FETs), such as junction field effect transistors (JFETs), and high electron mobility transistors (HEMTs). Similarly, the Schottky diodes may be replaced with traditional p-n diodes.

As illustrated, switch module SM1 may include either an n-channel or p-channel MOSFET Q1 that has a Schottky diode D1 connected in anti-parallel across the drain and source terminals of the MOSFET Q1. Switch modules SM2-SM4 are similarly configured. Switch module SM2 includes an n-channel MOSFET Q2 that has a Schottky diode D2 connected in anti-parallel across the drain and source terminals of the MOSFET Q2. Switch module SM3 may include either an n-channel or p-channel MOSFET Q3 that has a Schottky diode D3 connected in anti-parallel across the drain and source terminals of the MOSFET Q3. Switch module SM4 includes an n-channel MOSFET Q4 that has a Schottky diode D4 connected in anti-parallel across the drain and source terminals of the MOSFET Q4.

The switch modules SM1 and SM3 are considered on the "high" side, and the switch modules SM2 and SM4 are considered on the "low" side of the power module. The drains of MOSFETs Q1 and Q3 and the cathodes of diodes D1 and D3 are coupled together and to the power supply PS1. The source of MOSFET Q1, the anode of diode D1, the drain of MOSFET Q2, and the cathode of diode D2 are coupled together and to a first terminal of the motor M1. The source of MOSFET Q3, the anode of diode D3, the drain of MOSFET Q4, and the cathode of diode D4 are coupled together and to a second terminal of the motor M1. Finally, the sources of MOSFETs Q2 and Q4 and the anodes of diodes D2 and D4 are coupled to ground. The gates of MOSFETs Q1-Q4 are respectively driven by control signals S1-S4, which are provided by the control system CS1. Assume the motor M1 may be driven in both forward and reverse directions.

Figure 2:
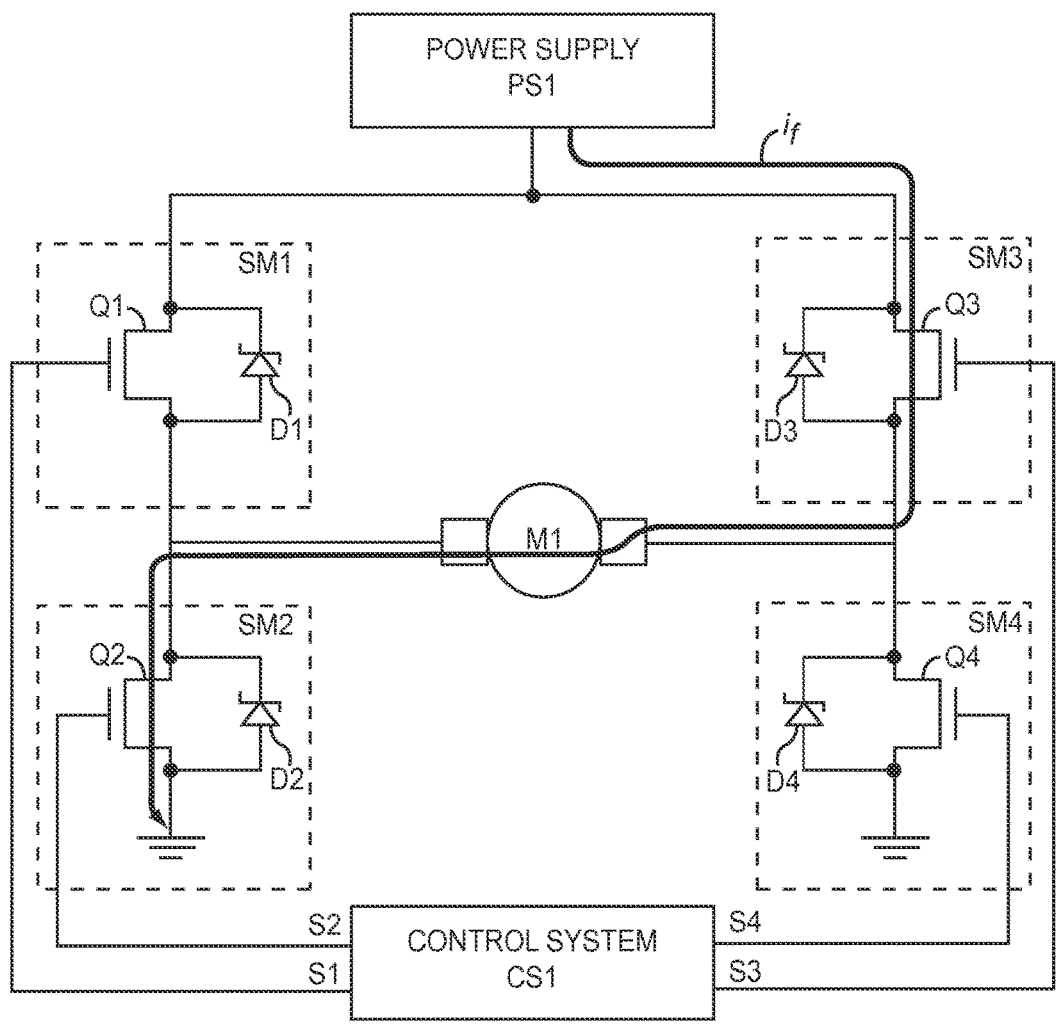
FIG. 2 illustrates a first current path in the H-bridge of FIG. 1 when driving the motor in a first direction.

For forward operation, assume control signals S1-S4 are configured to turn on MOSFETs Q2 and Q3 and turn off MOSFETs Q1 and Q4, which corresponds to driving the motor M1 in a forward direction. As illustrated in FIG. 2, a forward current $i_f$ flows from the power supply PS1 through MOSFET Q3, the motor M1, and the MOSFET Q2 to ground. If MOSFETs Q2 and Q3 stay on, the maximum forward current $i_f$ is provided and the motor M1 will turn in the forward direction at a maximum speed, with maximum torque, or a combination thereof.

To control the speed or torque, one or both of the MOSFETs Q2 and Q3 may be switched off and on at a duty cycle that corresponds to the speed or torque desired from the motor M1. As a result, the voltage supplied to the motor M1 is pulse width modulated, wherein the on-to-off switching ratio of the MOSFETs Q2 and Q3 dictates the average voltage presented to the Motor M1. The inductive nature of the motor M1 tries to keep the forward current $i_f$ constant, and as a result, averages the voltage presented to the motor M1 to a level corresponding to the on-to-off switching ratio of the MOSFETs Q2 AND Q3. The average voltage presented to the motor M1 dictates the forward current $i_f$ that is passed through the motor M1, and thus, controls the actual speed or torque of the motor M1.

Figure 3:
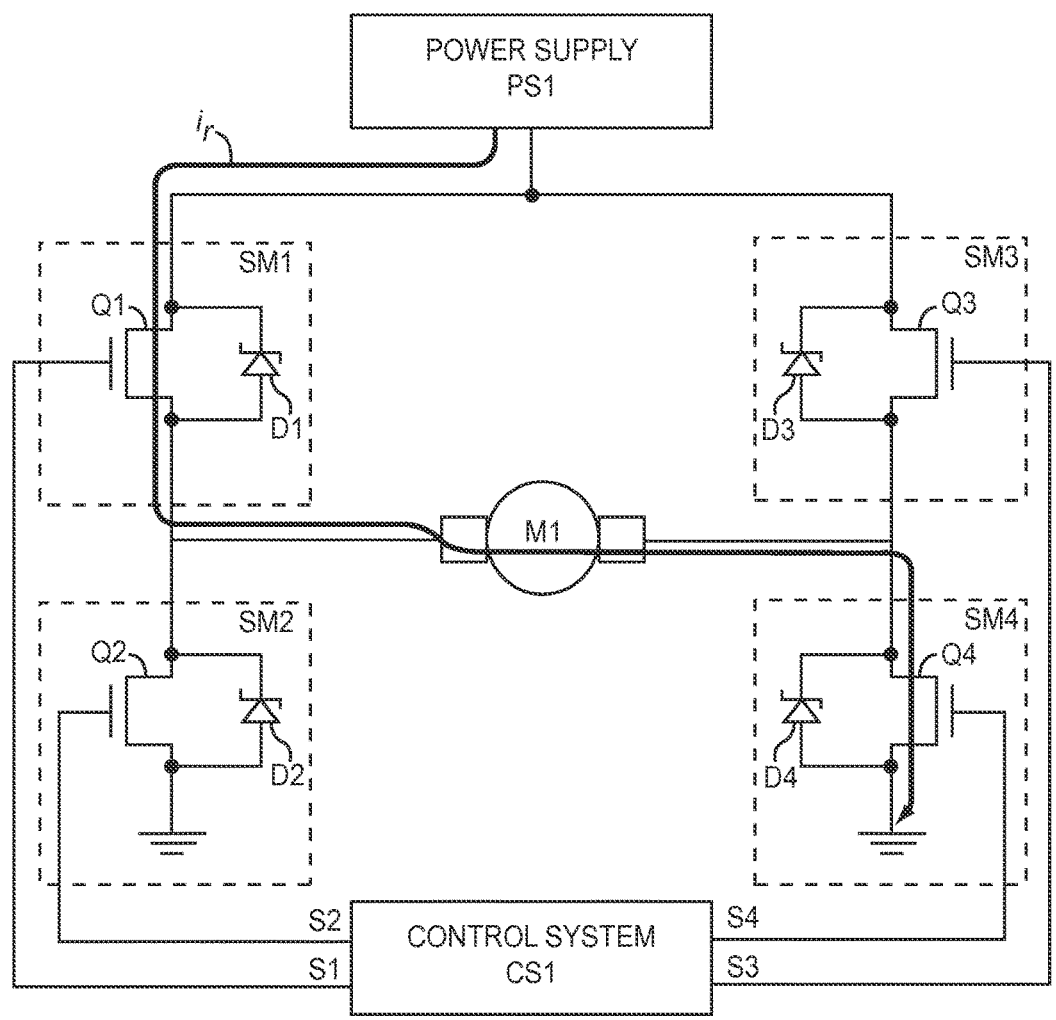
FIG. 3 illustrates a second current path in the H-bridge of FIG. 1 when driving the motor in a second direction.

For reverse operation, assume control signals S1-S4 are configured to turn on MOSFETs Q1 and Q4 and turn off MOSFETs Q2 and Q3. As illustrated in FIG. 3, a reverse current $i_r$ flows from the power supply PS1 through MOSFET Q1, the motor M1, and the MOSFET Q4 to ground. If MOSFETs Q1 and Q4 stay on, the maximum reverse current $i_r$ is provided and the motor M1 will turn in the reverse direction at a maximum speed, with maximum torque, or a combination thereof. Notably, the term "reverse" when used as an adjective in the term "reverse current $i_r$," merely refers to the direction of operation for the motor M1. The arrows provided in FIGS. 2 and 3, respectively, indicate the direction of current flow for both the forward current $i_f$ and the reverse current $i_r$.

As described above, the various MOSFETs Q1-Q4 may be turned on and off at a relatively high frequency to provide pulse width modulated voltage to the motor M1 for either forward or reverse operation as well as to switch from forward operation to reverse operation. When a pair of MOSFETs, such as MOSFETs Q2 and Q3 transition from an on-state to an off-state during forward operation, the forward current $i_f$ continues to flow through the motor M1 after the MOSFETs Q2 and Q3 are turned off, due to the electromagnetic field that is present in the inductive windings of the motor M1. At this point, all of the MOSFETs Q1-Q4 are off, yet the forward current $i_f$ remains flowing through the motor M1. Since the forward current $i_f$ cannot flow through any of the MOSFETS Q1-Q4 to a lower potential node, one or more of the Schottky diodes D1 though D4 may become forward biased and provide a path for the forward current $i_f$ to flow to either ground or the power supply PS1.

Figure 4:
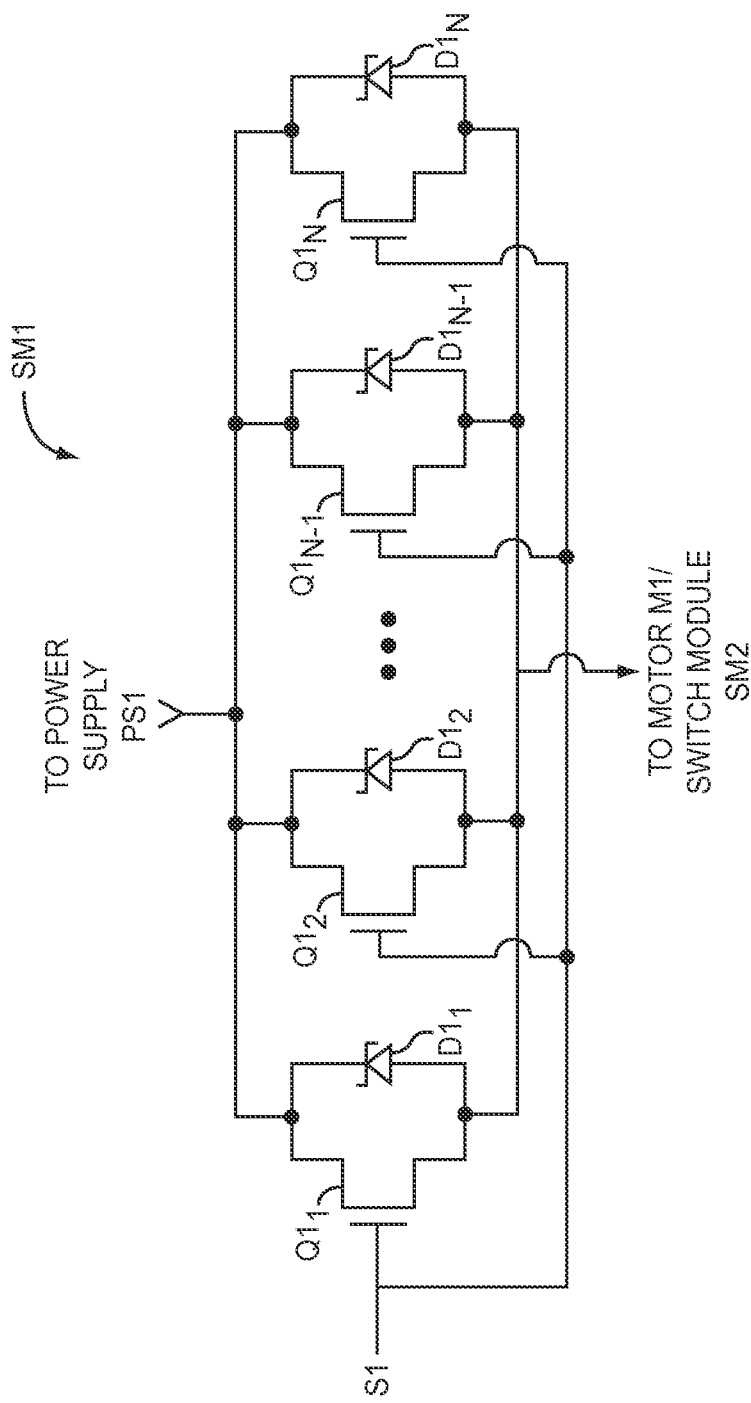
FIG. 4 is a circuit diagram of a switch module of the H-bridge of FIG. 1.

To increase the power handling of a switch module SM1-SM4, each of the MOSFETs Q1-Q4 may represent an array of effectively parallel transistors. Similarly, each of the Schottky diodes D1-D4 may represent an array of effectively parallel diodes. This concept is represented in FIG. 4 where an exemplary embodiment of switch module SM1 is illustrated. The other switch modules SM2-SM3 may be similarly configured.

As illustrated, switch module SM1 includes an array of MOSFETs $Q1_1$-$Q1_N$, which are effectively coupled in parallel, such that the drains are all coupled together and to the power supply PS1; the sources are all coupled together and to the motor M1 and switch module SM2; and the gates are coupled together and to the control system C1 (control signal S1). The Schottky diodes $D1_1$-$D1_N$ are coupled in anti-parallel across the drain and sources of the MOSFETs $Q1_1$-$Q1_N$. The number (N) of MOSFETs $Q1_1$-$Q1_N$ and Schottky diodes $D1_1$-$D1_N$ may range from two to more than 100, depending on the capability of each individual device and the application. Notably, there may be two or more Schottky diodes D1 for each MOSFET Q1, even though there is only a one-to-one relationship in the illustration.

Figure 5:
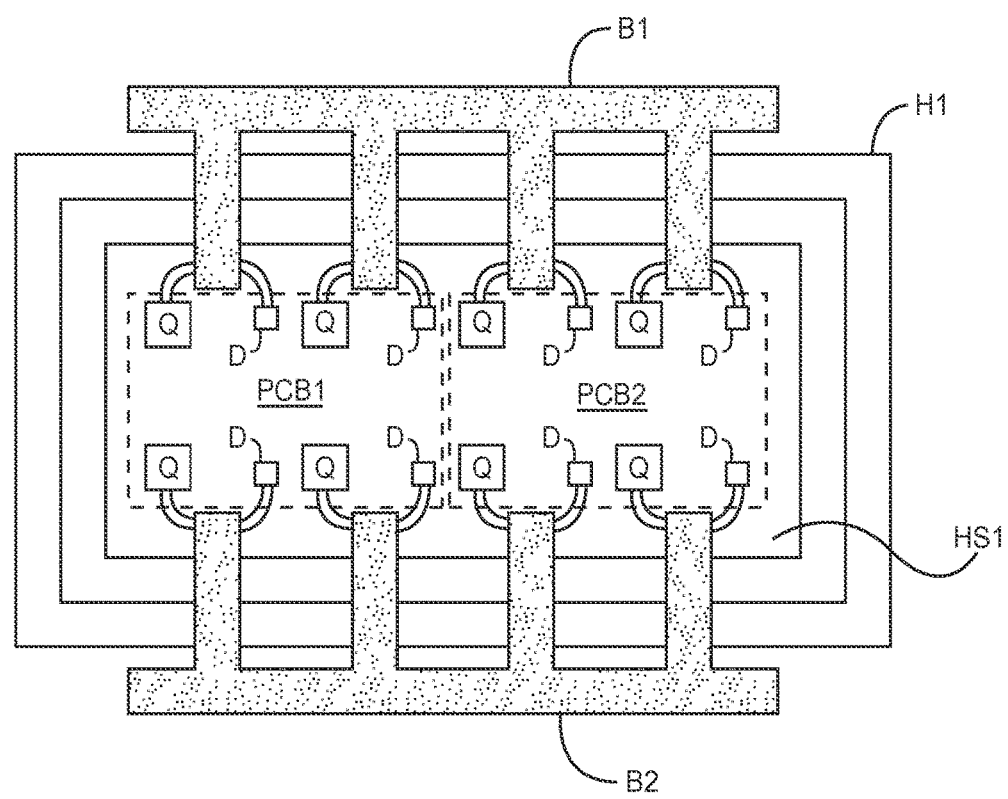
FIG. 5 is a top plan view of a power module according to one embodiment.
Figure 6:
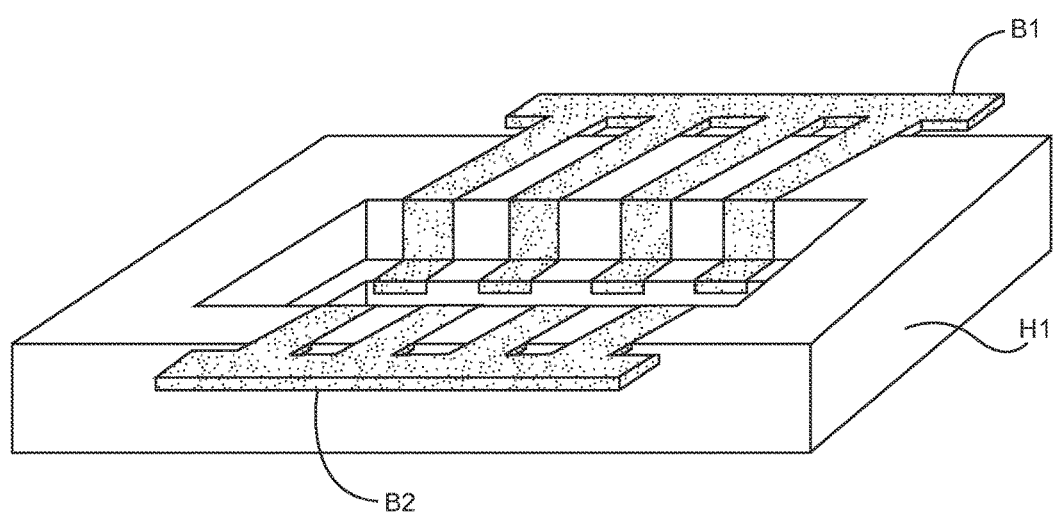
FIG. 6 is an isometric view of the power module of FIG. 5.

FIGS. 5 and 6 show top and perspective views of an exemplary power module. With reference to FIG. 5, rectangular housing H1 is provided with an interior chamber that holds one or more printed circuit boards PCB1 and PCB2. For clarity, the printed circuit boards PCB1 and PCB2 are not shown in FIG. 6. Each printed circuit board PCB1 and PCB2 is shown as having multiple transistors Q and diodes D that represent the primary components of the switch modules SW1-SW4. For example, the high and low side of the first half-H bridge formed by switch modules SW1 and SW2 are provided on printed circuit board PCB1, while the high and low side of the second half-H bridge formed by switch modules SW3 and SW4 are provided on printed circuit board PCB2. Together, the first and second half-H bridges form the above-described full-H bridge.

The necessary interconnects between the components on the printed circuit boards PCB1 and PCB2 are provided by metal traces (not shown) on the printed circuit boards PCB1 and PCB2. Bond wires may be used to make connections between the printed circuit boards PCB1 and PCB2 and one more connectors or buses B1 and B2. For example, bus B1 may be used to connect switch modules SM2 and SM4 to ground, and bus B2 may be used to connect switch modules SM1 and SM3 to the power supply PS1. These or other connectors may be used for the control signals S1-S4. The printed circuit boards PCB1 and PCB2 may be mounted to a mounting structure that is affixed to the housing H1. As illustrated, the mounting structure is a planar heat sink HS1 that also functions to dissipate heat generated by the switch modules SM1-SM4.

Again, the H-bridge configuration of the power module is just one of many available designs for power modules, especially those used to drive inductive loads. Alternatives to the H-bridge configuration for the power module include a half-H bridge and like known power switching or control circuits.

Regardless of the type of configuration of the power module, one metric for measuring the power handling capabilities of the device is current density of one of the switch modules SM1-SM4. This switch module current density is defined as the ratio of the maximum average current that a single switch module SM1-SM4 can handle to the interior area of the housing H1 that is allocated to the single switch module SM1-SM4. For the illustrated example, there are four switch modules SM1-SM4 of equal size. As such, the interior area of the housing H1 that is allocated to a single switch module SM1-SM4 is one-fourth (¼) the total interior area of the housing H1.

For example, assume the interior area of the housing H1 is 100 $cm^2$, and the maximum average current handling of one of the switch modules SM1-SM4 is 250 amperes. As such, the interior area of the housing H1 that is allocated to a single switch module SM1-SM4 is one-fourth of 100 $cm^2$, or 25 $cm^2$. The switch module current density is calculated by dividing the maximum average current handling of 250 amperes by the interior area of the housing H1 that is allocated to the single switch module SM1-SM4, which yields 10 amperes/$cm^2$.

The interior area of the housing H1 is defined as the maximum (two-dimensional) cross-sectional area of the interior of the housing H1 wherein the plane of measurement is along the plane in which one or more printed circuit boards PCB1 and PCB2 or one or more semiconductor die that provide the switch modules SM1-SM4 reside. For the illustrated example in FIG. 5, the interior area is defined by the perimeter P of the inside wall of the housing H1. The perimeter P is highlighted in bold. Notably, since the housing H1 may have various shapes and configurations in addition to the rectangular configuration shown in FIGS. 5 and 6, the interior areas need not be rectangular and the perimeter of the interior areas will follow the interior sidewalls of the housing H1. In one embodiment, the switch module current density is about 10 amperes/$cm^2$ or greater. In another embodiment, the switch module current density is about 12 amperes/$cm^2$ or greater. In another embodiment, the switch module current density is about 15 amperes/$cm^2$ or greater.

The following description outlines several transistor configurations that can be used in the power module as MOSFETs $Q1_N$-$Q4_N$ or alternatives thereto. Other transistor configurations may be employed. Some embodiments of the disclosure provide silicon carbide (SiC) insulated gate devices that are suitable for high power and/or high temperature applications.

Figure 7:
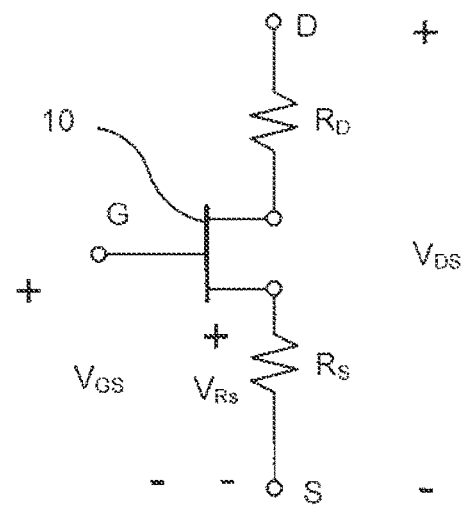
FIG. 7 is a circuit diagram of a metal-oxide-semiconductor field effect (MOSFET) device.

FIG. 7 is a circuit diagram of a metal oxide semiconductor field effect transistor (MOSFET) device 10. As shown therein, a MOSFET device generally includes three terminals, namely, a drain terminal (D), a source terminal (S) and a gate terminal (G). The gate-to-source voltage of the device is denoted $V_{GS}$, while the drain-to-source voltage of the device is denoted $V_{DS}$. The device has a built in source resistance $R_S$ and a built-in drain resistance $R_D$ based on the physical characteristics of the device. The voltage over the built-in source resistance $R_S$ is denoted $V_{Rs}$.

In a MOSFET device, current passing through a channel of the device from the drain to the source is regulated by applying a voltage to the gate. The gate is insulated from the channel by a gate insulator, such as silicon dioxide. As the voltage on the gate terminal is increased, current passing through the device may increase.

Figure 8:
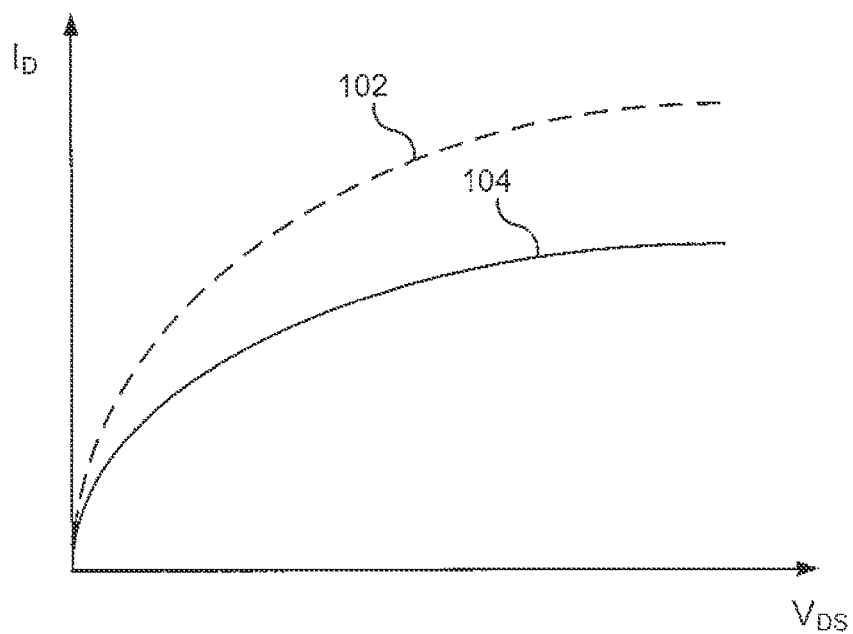
FIG. 8 is a graph illustrating hypothetical on-state current-voltage characteristics for a MOSFET device.

FIG. 8 is a graph illustrating hypothetical (curve 102) and actual (104) on-state current-voltage characteristics for a MOSFET device for a given gate-to-source voltage ($V_{GS}$). As shown in FIG. 8, for a given gate voltage, the current through the device ($I_D$) increases as the voltage between the drain and source ($V_{DS}$) increases, up to a saturation point. In actual devices, the actual saturation current of a transistor is typically less than the ideal saturation current. Part of the reason for this relates to the source resistance of the device.

Figure 9:
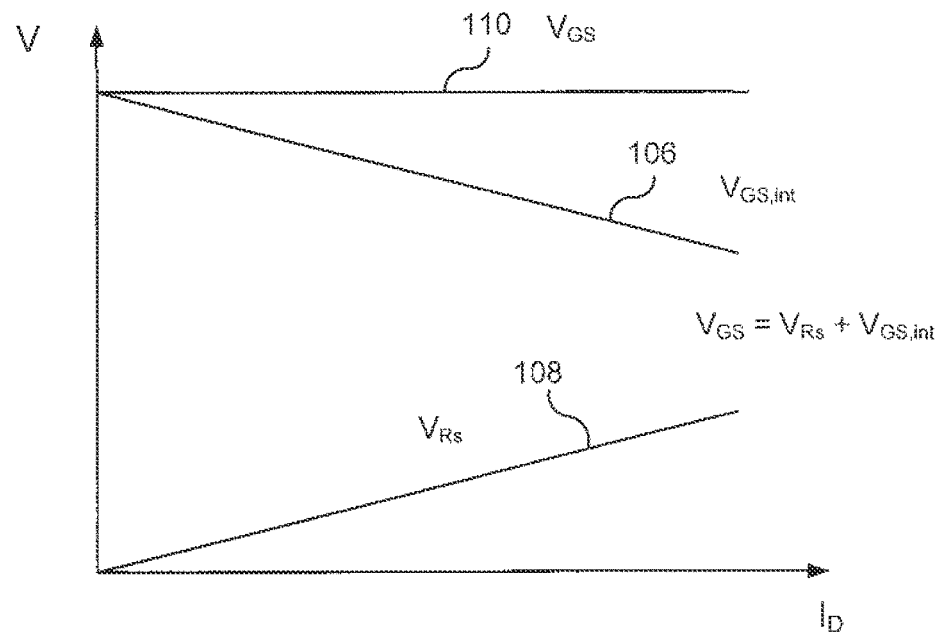
FIG. 9 is a graph illustrating the effect of source resistance on gate voltage.

In particular, as the drain current $I_D$ passing through the device increases, the amount of voltage dropped over the source resistance $R_S$ increases in direct proportion. FIG. 9 is a graph illustrating the effect of source resistance on gate voltage. In FIG. 9, the voltage from the gate terminal to the source terminal is denoted $V_{GS}$. A portion of the gate voltage $V_{GS}$ applied to the device across the gate and source terminals is dropped over the internal source resistance $R_S$ of the device. That portion of the gate voltage is denoted $V_{Rs}$ in FIG. 9. The remainder of the gate-to-source voltage appears as a voltage across the gate insulator, denoted $V_{GS,int}$ in FIG. 9. Thus, $V_{GS}$ is equal to the SUM of $V_{Rs}$ and $V_{GS,int}$.

As shown in FIG. 9, the gate-to-source voltage may remain constant as the drain current increases. However, the portion of the gate voltage $V_{GS}$ that is dropped over the internal source resistance of the device, $V_{Rs}$, increases as the drain current $I_D$ increases, while the portion of the gate-to-source voltage that appears as a voltage across the gate insulator, $V_{GS,int}$, decreases as the drain current $I_D$ increases.

Thus, as the drain current increases the portion of the gate voltage that is being used to maintain the channel decreases, which may cause the device to go into saturation at a lower level of drain-to-source voltage. Accordingly, a high source resistance can adversely affect the operation of a MOSFET or other insulated gate controlled device.

Figure 10:
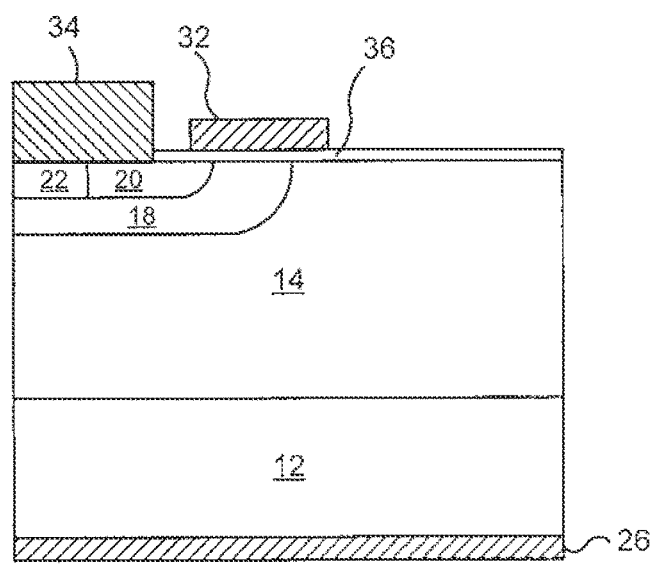
FIG. 10 is a partial cross sectional illustration of cell of a conventional power MOSFET device.

A unit cell 10 of a MOSFET structure according to some embodiments is shown in FIG. 10. The device 10 of FIG. 10 includes an n− drift epitaxial layer 14 on an n-type, 8° off-axis 4H—SiC substrate 12. The n− drift layer 14 may have a thickness of about 100 μm to about 120 μm, and may be doped with n-type dopants at a doping concentration of about $2 \times 10^{14}$ cm$^{-3}$ to about $6 \times 10^{14}$ cm$^{-3}$ for a blocking capability of about 10 kV. Other doping concentrations/voltage blocking ranges are also possible. For a 1200V MOSFET device, the substrate may be 4° off-axis 4H—SiC and the drift layer may have a thickness of about 10 μm and may be doped with n-type dopants at a doping concentration of about $6 \times 10^{15}$ cm$^{-3}$.

The structure further includes a p+ well region 18 and an n+ source region 20 that may be formed by selective implantation of, for example, aluminum and nitrogen, respectively. The junction depth of the p+ well region 18 may be about 0.5 μm, although other depths are possible. The structure 10 further includes a p+ contact region 22 that extends from a surface of the drift layer 14 into the p+ well region 18. A junction termination (not shown) may be provided around the device periphery.

All of the implanted dopants may be activated by annealing the structure at a temperature of about 1600° C. with a silicon over pressure and/or covered by an encapsulation layer such as a graphite film. A high temperature anneal may damage the surface of the silicon carbide epitaxy without these conditions. The silicon overpressure may be provided by the presence of silane, or the close proximity of silicon carbide coated objects that provide a certain amount of silicon overpressure. Alternatively or in combination with silicon overpressure, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional resist coating method and may have a thickness of about 1 μm. The graphite coating may be heated to form a crystalline coating on the drift layer 14. The implanted ions may be activated by a thermal anneal that may be performed, for example, in an inert gas at a temperature of about 1600° C. or greater. In particular the thermal anneal may be performed at a temperature of about 1600° C. in argon for 5 minutes. The graphite coating may help to protect the surface of the drift layer 14 during the high temperature anneal.

The graphite coating may then be removed, for example, by ashing and thermal oxidation.

After implant annealing, a field oxide of silicon dioxide (not shown) having a thickness of about 1 μm may be deposited and patterned to expose the active region of the device.

A gate oxide layer 36 may be formed by a gate oxidation process, with a final gate oxide thickness of 400-600 Å.

In particular, the gate oxide may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal may be performed at a temperature of about 950° C. or less for a time of at least about 1 hour. The temperature of the wet $O_2$ anneal may be limited to discourage further thermal oxide growth at the SiC/SiO$_2$ interface, which may introduce additional interface states. In particular, the wet $O_2$ anneal may be performed in wet $O_2$ at a temperature of about 950° C. for about 3 hours. The resulting gate oxide layer may have a thickness of about 500 Å.

In some embodiments, the dry $O_2$ oxide growth may be performed at a temperature of about 1175° C. in dry $O_2$ for about 4 hours. The resulting oxide layer may be annealed at a temperature of up to about 1175° C. in an inert atmosphere. In particular, the resulting oxide layer may be annealed at a temperature of about 1175° C. in Ar for about a time duration ranging from 30 min to 2 hours. Then the oxide layer receives an anneal in NO ambient at a temperature ranging from 1175° C. to 1300 C, for a duration ranging from 30 minutes to 3 hours. The resulting gate oxide layer may have a thickness of about 500 Å.

After formation of the gate oxide 34, a polysilicon gate 32 may be deposited and doped, for example, with boron followed by a metallization process to reduce the gate resistance. Al/Ni contacts may be deposited as the p-type ohmic source contact metal 28, and Ni as the n-type drain contact metal 26. All contacts may be sintered in a Rapid Thermal Annealer (RTA), and thick Ti/Au layers may be used for pad metals.

Referring to FIG. 10, the source resistance of a MOSFET device has two primary components, namely, the contact resistance $R_C$ between the source ohmic contact 34 and the source region 20, and the sheet resistance $R_{sheet}$ in the source region 20 between the source ohmic contact 34 and the channel. Thus, $R_S = R_C + R_{sheet}$. In a conventional silicon-based MOSFET device, the sheet resistance $R_{sheet}$ is the dominant factor in determining the source resistance, because it is possible to form very low resistivity ohmic contacts to silicon and other narrow-bandgap semiconductors. However, in wide bandgap semiconductors (i.e., semiconductors having a bandgap greater than about 2.0 V), including compound semiconductor materials, such as silicon carbide and gallium nitride, diamond, and ZnO, the contact resistance $R_C$ may be the dominant contributor to the source resistance. In particular, it is difficult to form very low resistivity ohmic contacts to silicon carbide and other wide bandgap materials because of the high energy barrier associated with such materials.

Figure 11:
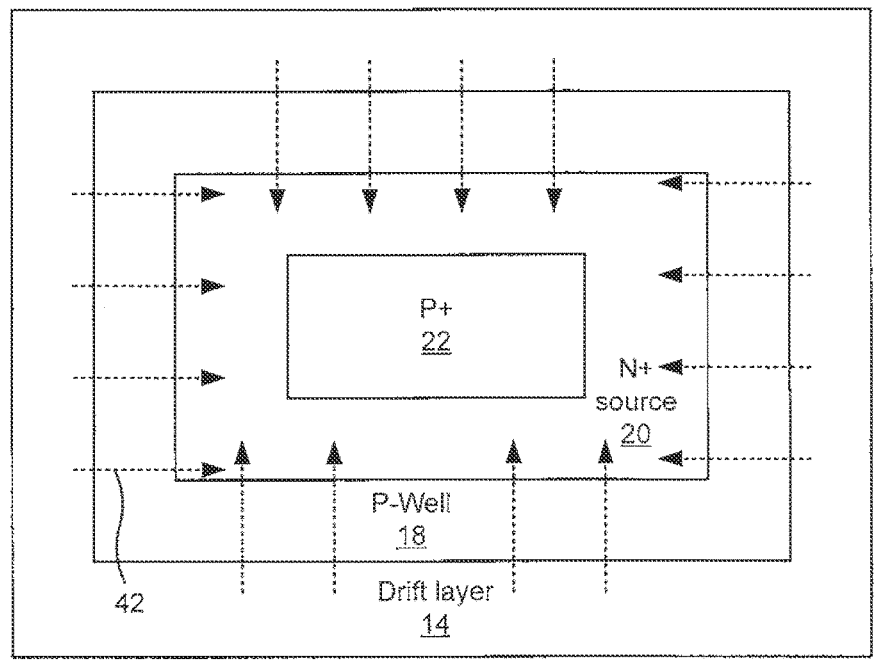
FIGS. 11 and 12 are plan views illustrating layouts of conventional power MOSFET devices.
Figure 12:
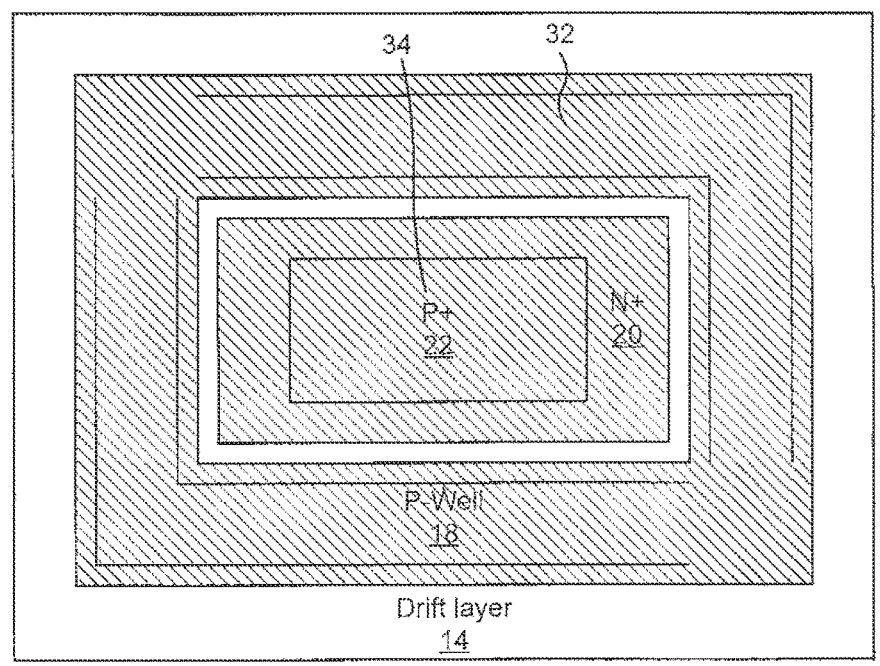

FIGS. 11 and 12 are plan views illustrating layouts of conventional power MOSFET devices. In a conventional power MOSFET device, the layout is designed to reduce or minimize sheet resistance under the assumption that contact resistance is less important than sheet resistance. Thus, referring to FIG. 11, a conventional power MOSFET device typically includes a p-well 18 formed in a drift layer 14, an n+ source region 20 in the p-well 18, and a p+ contact region 22 in the n+ source region 20. Referring to FIG. 12, a source contact 34 is formed on the n+ source region 20 and the p+ contact region 22. A gate 32 is formed over the p-well 18 and overlaps the periphery of the n+ source region 20 and adjacent portions of the drift layer 14. Current flow from the drain to the source is indicated by the arrows 42 in FIG. 11.

As noted above, in a wide bandgap semiconductor material system, the source resistance may be more affected by the contact resistance of the source ohmic contact than by the sheet resistance of the source layer. Accordingly, to decrease the source resistance of a wide bandgap power semiconductor device, it may be desirable to decrease the contact resistance of the source ohmic contact. In general, contact resistance can be decreased by increasing the minimum dimension of the contact, which is the smallest dimension of the contact in any direction. However, simply increasing the minimum dimension of the source ohmic contact of an electronic device can undesirably increase the cell to cell spacing, or pitch, of the device. The pitch of a MOSFET device may be proportional to the width of the p-well region of the device. Increasing the pitch of the device reduces the density of the devices that can be formed on a single substrate, reducing the devices yielded and increasing manufacturing costs.

According to some embodiments, an insulated gate device layout is provided that increases the minimum dimension of the source ohmic contact without increasing the pitch of the device and/or the width of the p-well region of the device. A device layout according to some embodiments may increase the sheet resistance of the device. Such an effect may be highly undesirable in a device based on a narrow bandgap semiconductor material. However, since sheet resistance is not the dominant factor in determining source resistance of a wide bandgap device, such a tradeoff may be acceptable for wide bandgap devices. In devices according to some embodiments, a ratio of the source sheet resistance to the source contact resistance may be greater than 0.75 (i.e. $R_{sheet}/R_C > 0.75$). In some embodiments, the device may have a source contact resistance that is less than the source sheet resistance. That is, in some embodiments, the ratio of the source sheet resistance to the source contact resistance may be greater than 1 (i.e. $R_{sheet}/R_C > 1$), and in further embodiments, the ratio of the source sheet resistance to the source contact resistance may be greater than 5.

Figure 13:
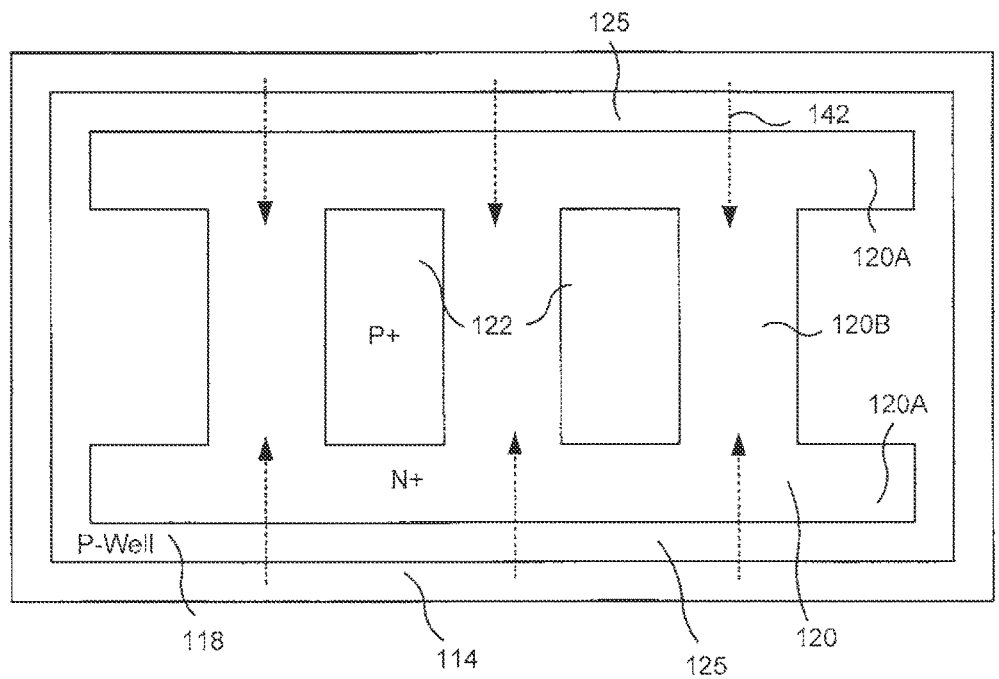
FIGS. 13 and 14 are plan views illustrating layouts of power MOSFET devices according to some embodiments.
Figure 14:
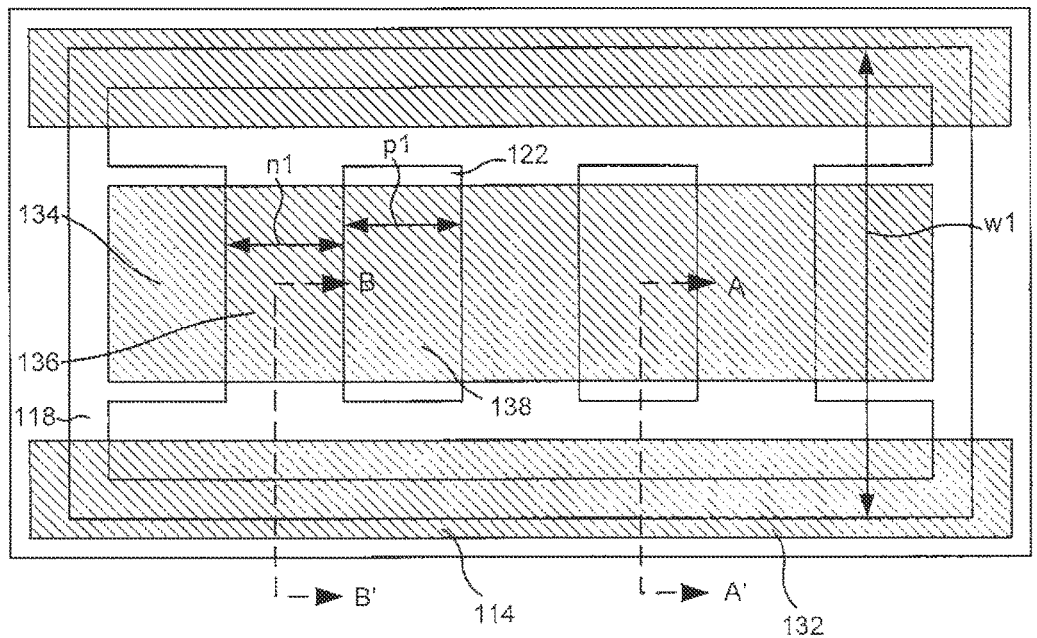
Figure 15:
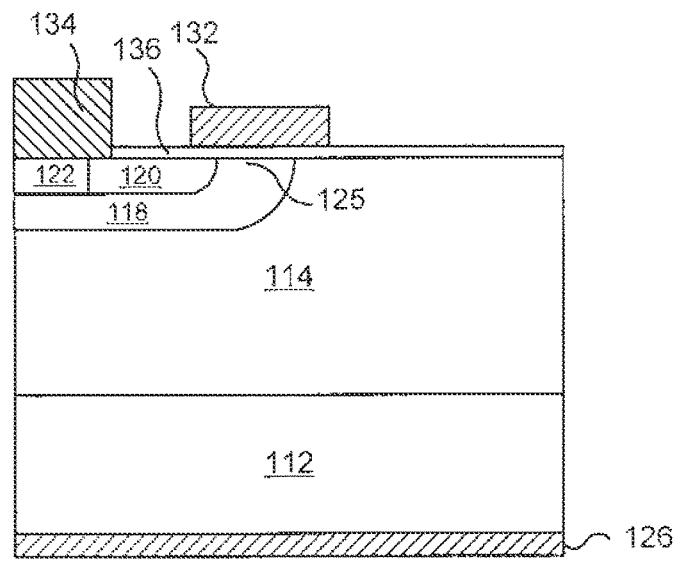
FIGS. 15 and 16 are partial cross sectional illustrations of a cell of a power MOSFET device according to some embodiments.
Figure 16:
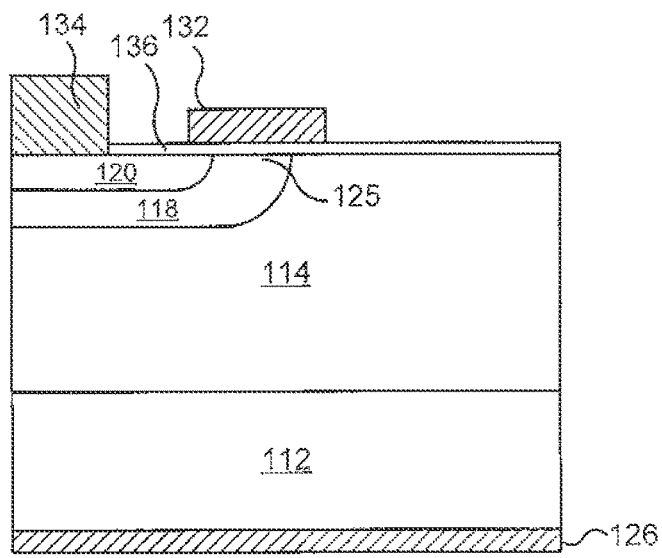

FIGS. 13 and 14 are plan views illustrating layouts of MOSFET device cells 100 according to some embodiments, and FIGS. 15 and 16 are partial cross sectional illustrations of a cell of a MOSFET device according to some embodiments. In particular, FIG. 15 is a cross section taken along line A-A' of FIG. 13, while FIG. 16 is a cross section taken along line B-B' of FIG. 14.

The device 100 shown in FIGS. 13-16 includes an n− drift epitaxial layer 114 on an n-type, 8° off-axis 4H—SiC substrate 112. The n− drift layer 114 may have a thickness of about 100 μm to about 120 μm, and may be doped with n-type dopants at a doping concentration of about $2 \times 10^{14}$ cm$^{-3}$ to about $6 \times 10^{14}$ cm$^{-3}$ for a blocking capability of about 10 kV. For a 1200V MOSFET device, the substrate may be 4° off-axis 4H—SiC and the drift layer may have a thickness of about 10 μm and may be doped with n-type dopants at a doping concentration of about $6 \times 10^{15}$ cm$^{-3}$.

The structure further includes a p+ well region 118 and an n+ source region 120 that may be formed by selective implantation of, for example, aluminum and nitrogen, respectively. The junction depth of the p+ well region 118 may be about 0.5 μm. The structure 100 further includes a plurality of p+ contact regions 122 that extend from a surface of the drift layer 114 into the p+ well region 118. A junction termination (not shown) may be provided around the device periphery.

Referring to FIG. 13, the n+ source region 120 includes a pair of lateral source regions 120A that are parallel to opposing channel regions 125 in the p-well 118. A plurality of source contact regions 120B extend between the lateral source regions 120A, and the plurality of p+ contact regions 122 are provided between the source contact regions 120B.

Referring to FIG. 14, gate contacts 132 are formed over the channel regions 125 and overlap the lateral source regions 120A. A source ohmic contact 134 is formed across the source contact regions 120B and the p+ contact regions 122. The source ohmic contact 134 overlaps the source contact regions 120B in a source contact region 136. The source ohmic contact 134 overlaps the p+ contact regions 122 in a body contact region 138.

The portion of the source contact regions 120B contacted by the source ohmic contact 134 may have a minimum dimension that is larger than the minimum dimension that can be obtained for a conventional layout such as the layout shown in FIGS. 11 and 12 for a similar pitch/p-well size. Accordingly, the source contact resistance may be reduced without substantially increasing the device pitch/p-well size. The "minimum dimension" of a feature refers to the smallest width of the feature in any cross section of the feature. For example, the minimum dimension p1 of the body contact region 138, the minimum dimension n1 of the n-type contact region 136 and the minimum dimension w1 of the p-well region 118 are shown in FIG. 14.

In a device having a layout as shown in FIGS. 13 and 14, current flow to the source contact flows through the source contact regions 120B, as indicated by the arrows 142 in FIG. 13. The source contact regions 120B may have an increased sheet resistance compared to the source region of a device having a conventional layout as shown in FIGS. 11 and 12. However, the increase in sheet resistance may be more than compensated by the decrease in contact resistance, thus providing an overall decrease in the source resistance of the device.

Figure 17:
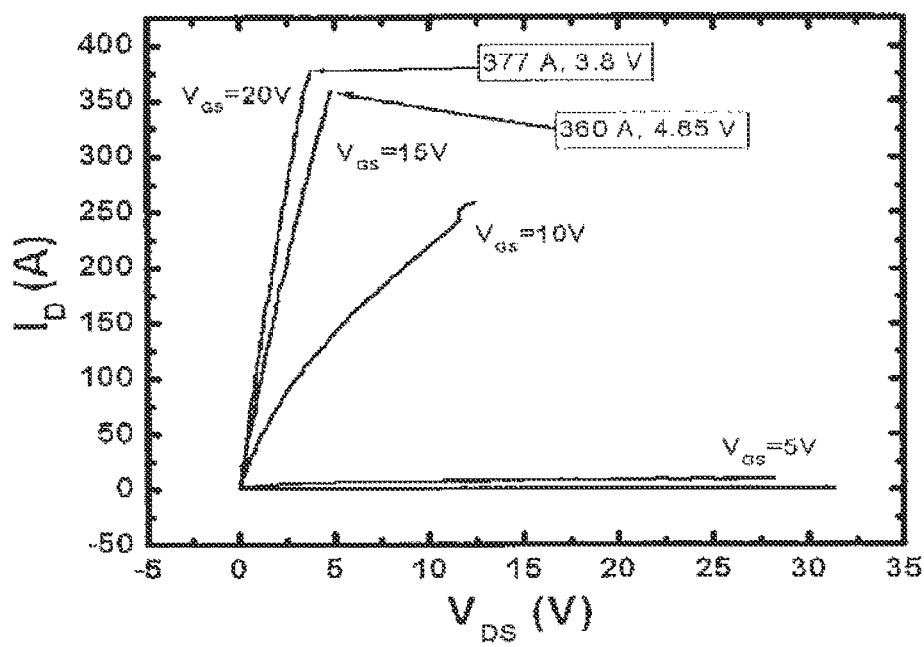
FIG. 17 is a graph on-state current-voltage characteristics for a MOSFET device according to some embodiments.

FIG. 17 is a graph of on-state current-voltage characteristics for a 7 mm×8 mm 1200 V silicon carbide MOSFET device according to some embodiments. In the device characteristics illustrated in FIG. 17, a drain current ($I_D$) of 377 A was measured at a forward voltage drain-to-source voltage ($V_{DS}$) of 3.8 V. The current density, normalized to the active area, was over 750 A/cm$^2$.

The on-resistance of a MOSFET device is affected by the drain resistance, the channel resistance and the source resistance of the device. Accordingly, reducing the source resistance of the device also reduces the on-resistance of the device.

A wide bandgap MOSFET device having a layout according to some embodiments may be capable of substantially increased saturation current due to the lower on-resistance of the device and the fact that increased current levels have less of a de-biasing effect on the gate. That is, because of the lower source resistance, less voltage will be developed over the source resistance as the drain current increases. Thus, more of the gate-to-source voltage is applied to the channel of the device.

Figure 18:
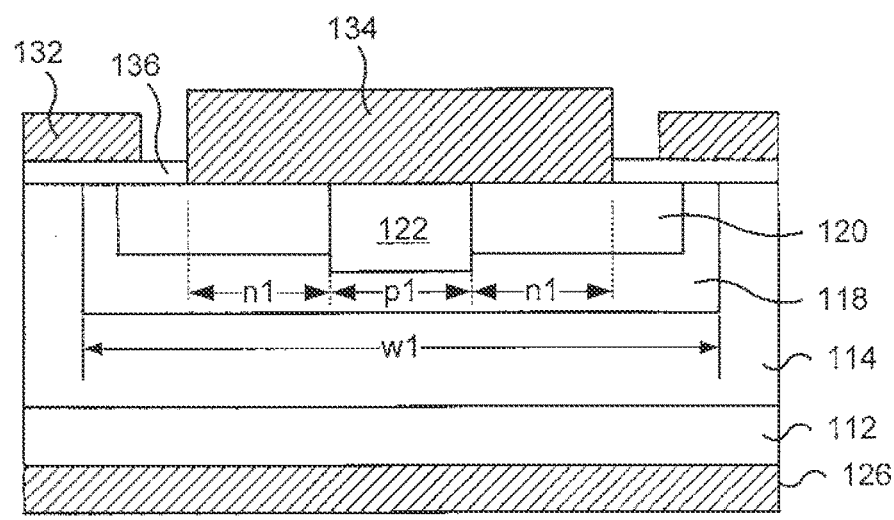
FIG. 18 is a cross sectional illustration of cell of a power MOSFET device according to some embodiments.

FIG. 18 is an idealized cross section of a device having a layout in accordance with some embodiments. In particular, FIG. 18 illustrates some dimensions of a device having a layout in accordance with some embodiments. For example, as shown in FIG. 18, the minimum dimension of the implanted cell area (i.e. the p-well 118) is denoted as width w1 in FIG. 18. It will be appreciated, however, that the minimum dimension of the p-well 118 may occur in a dimension that is different from the plane of the device illustrated in FIG. 18. For example, the minimum dimension of the p-well 118 may occur in a dimension that is perpendicular to the plane of the device illustrated in FIG. 18.

The minimum dimension of the n-type contact area is denoted as width n1 in FIG. 18, while the minimum dimension of the p-type contact area is denoted as width p1 in FIG. 18. The n-type contact area may be defined as the area of overlap between the source ohmic contact 132 and the n+ source region 120, while the p-type contact area may be defined as the area of overlap between the source ohmic contact 132 and the p+ contact regions 122.

Figure 19:
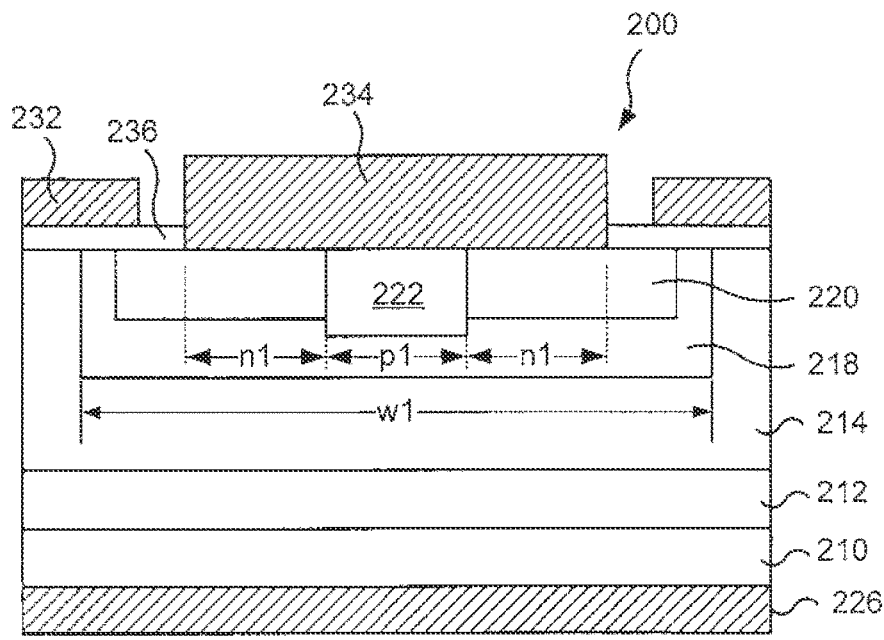
FIG. 19 is a cross sectional illustration of cell of an insulated gate bipolar transistor device according to some embodiments.

An insulated gate bipolar transistor (IGBT) device 200 according to some embodiments is illustrated in FIG. 19. As shown therein, the IGBT device includes an n− drift epitaxial layer 214 on a p-type epitaxial layer 212. The p-type epitaxial layer 212 is formed on a heavily doped p-type, 8° off-axis 4H—SiC substrate or layer 210. The n− drift layer 214 may have a thickness of about 100 µm to about 120 µm, and may be doped with p-type dopants at a doping concentration of about $2 \times 10^{14}$ cm$^{-3}$ to about $6 \times 10^{14}$ cm$^{-3}$ for a blocking capability of about 10 kV.

The IGBT structure 200 further includes a p+ well region 218 and an n+ source/emitter region 220 that may be formed by selective implantation of, for example, aluminum and nitrogen, respectively. The junction depth of the p+ well region 218 may be about 0.5 µm. The structure 200 further includes a plurality of p+ body contact regions 222 that extend from a surface of the drift layer 214 into the p+ well region 218. The conductivity types may be reversed in some embodiments.

A gate contact 232 is on a gate insulator 236, a source/emitter contact 234 is on the source contact regions 220 and the body contact regions 222. A collector contact 226 contacts the substrate 210.

According to some embodiments, a transistor device may have a ratio of n1 to w1 that is greater than 0.2. In further embodiments, a transistor device may have a ratio of n1 to w1 that is greater than about 0.3. In further embodiments, a transistor device may have a ratio of n1 to w1 that is in the range of about 0.2 to 1. In further embodiments, a transistor device may have a ratio of n1 to w1 that is in the range of about 0.3 to 1. In further embodiments, transistor device may have a ratio of n1 to w1 that is greater than 0.5. For example, the minimum dimension n1 of the n-type contact area of a device having a layout according to some embodiments may be about 2 µm for a device having a minimum dimension of the implanted cell area of 6 µm.

According to some embodiments, a transistor device may have a ratio of p1 to w1 that is greater than 0.2. In further embodiments, a transistor device may have a ratio of p1 to w1 that is greater than about 0.3. In further embodiments, a transistor device may have a ratio of p1 to w1 that is greater than about 0.5. In further embodiments, a transistor device may have a ratio of p1 to w1 that is in the range of about 0.2 to 0.5. In further embodiments, a transistor device may have a ratio of p1 to w1 that is in the range of about 0.2 to 1.

Some embodiments provide transistor devices having increased current densities. Current density is defined as the total current divided by the area of the chip. For example, a wide bandgap transistor device according to some embodiments may be capable of current densities in excess of 200 A/cm$^2$ and a blocking voltage of 1000 V or more. A wide bandgap transistor device according to further embodiments may be capable of a current of 100 A or greater at current densities in excess of 200 A/cm$^2$, a forward voltage drop of less than 5 V and a blocking voltage of 1000 V or more. A wide bandgap transistor device according to still further embodiments may be capable of a current of 100 A or greater at current densities in excess of 300 A/cm$^2$, a forward voltage drop of less than 5 V and a blocking voltage of 1000 V or more.

A semiconductor device according to some embodiments has a reverse blocking voltage in excess of 1000 volts and a current density greater than 200 amps per square centimeter at a current greater than 100 A.

A semiconductor device according to further embodiments has a reverse blocking voltage of 1000 volts or more and a forward current capability greater than 100 A at a forward voltage of 5 volts or less.

A metal-oxide semiconductor field effect transistor device according to some embodiments has a reverse blocking voltage of 1200 volts or more and a forward current capability greater than 100 A.

A metal-oxide semiconductor field effect transistor device according to some embodiments has a reverse blocking voltage of 1000 volts or more and a differential on-resistance less than 8 mOhms-cm$^2$.

A semiconductor device having a blocking voltage less than 1000 V and configured to pass forward current at a current density greater than 200 amps per square centimeter at a forward voltage drop of 5 V or less.

Some embodiments may enable wide bandgap transistor devices to achieve drain currents of 100 Amps or higher at a drain to source voltage that is less than 4 Volts in a device having a cell pitch of less than 20 µm. Some embodiments may enable wide bandgap transistor devices to achieve drain currents of 100 Amps or higher at a drain to source voltage that is less than 4 Volts in a device having a cell pitch of less than 10 µm. Some embodiments may enable wide bandgap transistor devices to achieve drain currents of 80 Amps or higher at a drain to source voltage that is less than 5 Volts in a device having a cell pitch of less than 10 µm.

An IGBT device according to some embodiments with a voltage blocking capability of 10 kV or greater may have a differential specific on-resistance of less than 14 mOhm-cm$^2$ with a forward voltage drop of 5.2 V or less at a current density of 100 A/cm$^2$.

Figure 20:
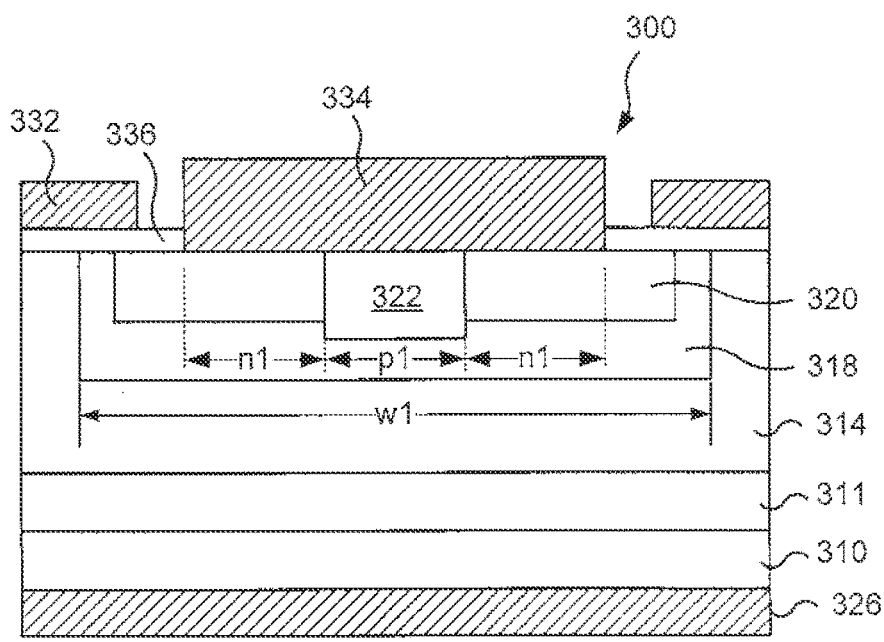
FIG. 20 is a cross sectional illustration of cell of a p-type insulated gate bipolar transistor device according to some embodiments.

A p-type insulated gate bipolar transistor (p-IGBT) device 300 according to some embodiments is illustrated in FIG. 20. As shown therein, the IGBT device includes a p− drift epitaxial layer 314 on a p-type field stop buffer layer 311 formed on an n-type, 8° off-axis 4H—SiC substrate 310. The p− drift layer 314 may have a thickness of about 100 µm to about 200 µm, and may be doped with p-type dopants at a doping concentration of about $2 \times 10^{14}$ cm$^{-3}$ to about $6 \times 10^{14}$ cm$^{-3}$.

The p-IGBT structure 300 further includes an n+ well region 318 and a p+ source/emitter region 320 that may be formed by selective implantation of, for example, nitrogen and aluminum, respectively. The junction depth of the n+ well region 318 may be about 0.5 μm. The structure 300 further includes a plurality of n+ body contact regions 322 that extend from a surface of the drift layer 314 into the n+ well region 318.

A gate contact 332 is on a gate insulator 336, a source/emitter contact 334 is on the source contact regions 320 and the body contact regions 322. A collector contact 326 contacts the substrate 310.

A 4H—SiC p-IGBT as shown in FIG. 20 was fabricated using a $2 \times 10^{14}$ cm$^{-3}$ doped, 140 μm thick p-type epilayer as the drift layer 314, and a 2 μm thick p-type Field-Stop buffer layer 311, with a doping concentration ranging from $1 \times 10^{17}$ cm$^{-3}$ to $5 \times 10^{17}$ cm$^{-3}$. A multi-zone JTE (15 zone) edge termination structure (not shown) was formed by nitrogen ion implantation. JTE terminations are described, for example, in U.S. Pat. No. 6,002,159, which is incorporated herein by reference. MOS channels were formed on implanted n-wells 318. A 50 nm thick thermally grown oxide layer was used as the gate insulator 336.

Figure 21:
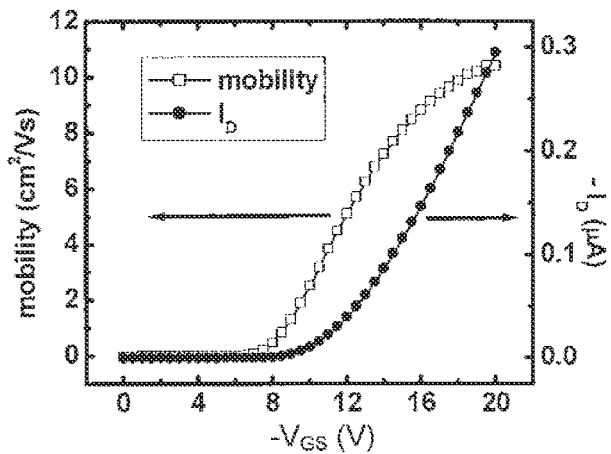
FIG. 21 is a graph showing current-voltage characteristics of the P-IGBT device of FIG. 20.

FIG. 21 shows the $I_D$-$V_{GS}$ characteristics of the p-IGBT device shown in FIG. 20, with $V_{DS}$ fixed at −50 mV. The $I_D$-$V_{GS}$ characteristics were measured from a test MOSFET with a W/L of 200 μm/200 μm, fabricated on the same wafer. A threshold voltage of −10 V, and a peak MOS channel mobility of 10 cm$^2$/Vs were extracted from the $I_D$-$V_{GS}$ characteristics.

Figure 22:
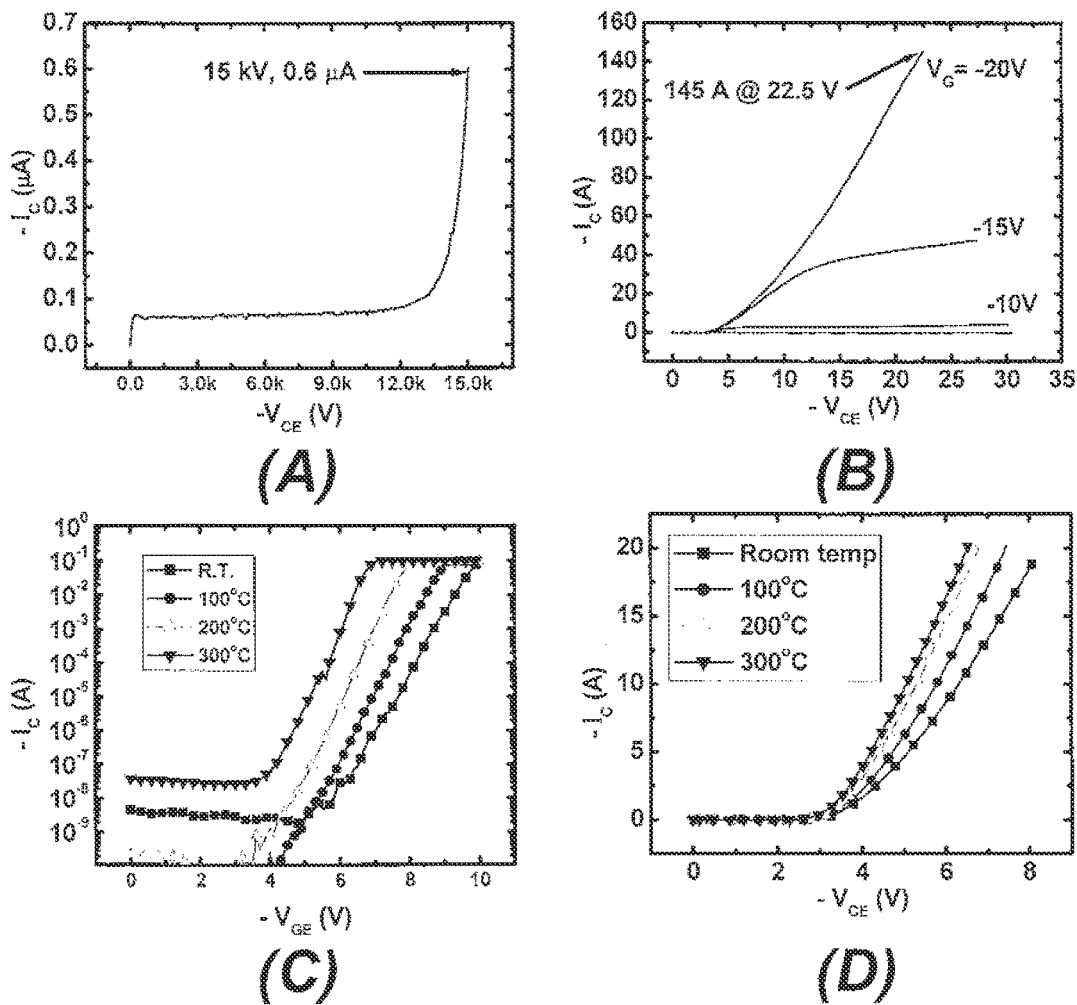
FIG. 22A is a graph showing voltage blocking characteristics of the p-IGBT of FIG. 20.
FIG. 22B is a graph showing pulsed on-state current-voltage characteristics of the P-IGBT of FIG. 20.
FIG. 22C is a graph showing further on-state current-voltage characteristics of the P-IGBTs of FIG. 20 for temperatures ranging from room temperature to 300° C.
FIG. 22D is a graph showing on-state current-voltage characteristics of the P-IGBTs of FIG. 22 as a function of temperature.

FIG. 22A shows the blocking characteristics ($V_{GE}$=0 V) of a 6.7 mm×6.7 mm 4H—SiC P-IGBT, with an active area of 0.16 cm$^2$ at room temperature. The measurement voltage was limited to −15 kV, due to the limitation of probing equipment. The device showed a leakage current of 0.6 μA, which corresponds to a leakage current density of 1.2 μA/cm$^2$ at a $V_{CE}$ of −15 kV. This is the highest blocking voltage ever reported in SiC power switches. FIG. 22B shows the pulsed on-state I-V characteristics of the p-IGBT, measured using a Tektronix 371 curve tracer. The device showed an on-state current of −145 A, which represents a current density of 906 A/cm$^2$, at a $V_{CE}$ of −22.5 V and a $V_{GE}$ of −20 V. No evidence of parasitic thyristor latch-up was observed during this measurement. FIG. 22C shows $I_C$-$V_{GE}$ characteristics of the 4H—SiC P-IGBTs for temperatures ranging from room temperature to 300° C. $V_{CE}$ was fixed at −10V for this measurement. The I-V characteristics shifted towards zero at elevated temperature. However, the device maintained normally-off properties throughout the temperature range. FIG. 22D shows the on-state I-V characteristics as a function of temperature. $V_{GE}$ was fixed at −20 V for this measurement. A monotonic decrease in forward voltage drop with increasing temperature was observed. This is believed due to the increase in minority carrier (electron) diffusion length, caused by increased carrier lifetime at elevated temperatures.

Accordingly, a p-IGBT according to some embodiments may have a reverse blocking voltage that is greater than about 10 kV, and in some cases greater than about 13 kV, and that has a forward current capability greater than 5 Amps.

It will be appreciated that although some embodiments of the disclosure have been described in connection with silicon carbide IGBT and MOSFET devices having n-type drift layers, the present disclosure is not limited thereto, and may be embodied in devices having p-type substrates and/or drift layers. Furthermore, the disclosure may be used in many different types of devices, including but not limited to insulated gate bipolar transistors (IGBTs), MOS controlled thyristors (MCTs), insulated gate commutated thyristors (IGCTs), junction field effect transistors (JFETs), high electron mobility transistors (HEMTs), etc.

In the drawings and specification, there have been disclosed typical embodiments of the disclosure and, although specific terms are employed, they are used in a generic and descriptive sense only and not for purposes of limitation, the scope of the disclosure being set forth in the following claims.

What is claimed is:

1. A power module comprising
   a housing with an interior chamber; and
   a plurality of switch modules mounted within the interior chamber and comprising a plurality of transistors and a plurality of diodes interconnected to facilitate switching power to a load wherein at least one of the plurality of switch modules supports a current density of at least 10 amperes per cm$^2$ and handles a voltage greater than 10 kV.

2. The power module of claim 1 wherein the interior chamber is associated with an interior area and the current density is defined as a ratio of maximum average current that the one of the plurality of switch modules supports to the interior area that is allocated to the one of the plurality of switch modules.

3. The power module of claim 1 wherein the at least one of the plurality of switch modules supports a current density of at least 12 amperes per cm$^2$.

4. The power module of claim 1 wherein the at least one of the plurality of switch modules supports a current density of at least 15 amperes per cm$^2$.

5. The power module of claim 1 wherein each of the plurality of switch modules forms a portion of a full H-bridge or a half H-bridge.

6. The power module of claim 1 wherein the plurality of transistors are connected in parallel with each other and in anti-parallel with the plurality of diodes.

7. The power module of claim 1 wherein the plurality of transistors and the plurality of diodes are formed from silicon carbide.

8. The power module of claim 1 wherein at least two of the plurality of transistors each comprises:
   a drift layer having a first conductivity type;
   a well region in the drift layer having a second conductivity type opposite the first conductivity type;
   a source region in the well region, the source region having the first conductivity type and defining a channel region in the well region, wherein the source region comprises a lateral source region adjacent the channel region and a plurality of source contact regions extending away from the lateral source region opposite the channel region;
   a body contact region having the second conductivity type between at least two of the plurality of source contact regions and in contact with the well region; and
   a source ohmic contact that overlaps at least one of the source contact regions and the body contact region, and that does not overlap the lateral source region.

9. The power module of claim 1 wherein at least two of the plurality of transistors each comprises:
   a drift layer having a first conductivity type;
   a well region having a second conductivity type that is opposite the first conductivity type;
   a source region in the well region, the source region having the first conductivity type;
   a body contact region having the second conductivity type in contact with the well region; and a source ohmic contact that overlaps the source region in a source contact area and that overlaps the body contact region in a body contact region area;

wherein a ratio of a minimum dimension n1 of the source contact area to a minimum dimension w1 of the well region is greater than 0.2.

10. The power module of claim 1 wherein at least two of the plurality of transistors each comprises:
a drift layer having a first conductivity type;
a well region having a second conductivity type that is opposite the first conductivity type;
a source region in the well region, the source region having the first conductivity type;
a body contact region having the second conductivity type in contact with the well region; and
a source ohmic contact that overlaps the source region in a source contact area and that overlaps the body contact region in a body contact region area;
wherein a ratio of a minimum dimension p1 of the body contact region area to a minimum dimension w1 of the well region is greater than 0.2.

11. The power module of claim 1 wherein at least two of the plurality of transistors each has a reverse blocking voltage in excess of 1000 volts and has a current density greater than 200 amps per square centimeter at a current greater than 100 A.

12. The power module of claim 1 wherein at least two of the plurality of transistors each has a reverse blocking voltage of 1000 volts or more and has a forward current capability greater than 100 A at a forward voltage of 5 volts or less.

13. The power module of claim 1 wherein at least two of the plurality of transistors have a reverse blocking voltage of 1200 volts or more.

14. The power module of claim 1 wherein at least two of the plurality of transistors are metal-oxide semiconductor field effect transistor devices having a reverse blocking voltage of 1000 volts or more and having a differential on-resistance less than 8 mOhms-cm$^2$.

15. The power module of claim 1 wherein at least two of the plurality of transistors each has a blocking voltage less than 1000 V and is configured to pass forward current at a current density greater than 200 amps per square centimeter at a forward voltage drop of 5 V or less.

16. The power module of claim 1 wherein at least two of the plurality of transistors are insulated gate bipolar transistor devices having a forward voltage drop of 5.2 V or less at a current density of 100 A/cm$^2$.

17. The power module of claim 1 wherein at least two of the plurality of transistors are metal-oxide semiconductor field effect transistor devices having a drain to source voltage that is less than 4 Volts and a cell pitch of less than 20 μm and having a forward current capability greater than 100 A.

18. The power module of claim 17 wherein the cell pitch is less than 10 μm.

19. The power module of claim 1 wherein at least two of the plurality of transistors are metal-oxide semiconductor field effect transistor devices having a drain to source voltage that is less than 5 Volts and a cell pitch of less than 10 μm and having a forward current capability greater than 80 A.

20. The power module of claim 1 wherein at least two of the plurality of transistors are insulated gate bipolar transistor devices having a blocking voltage of 13 kV or more and a forward current capability of 5 A or greater.

21. The power module of claim 1 wherein the at least one of the plurality of switch modules supports a current density of 15 amperes per cm$^2$.

22. The power module of claim 1 wherein the at least one of the plurality of switch modules handles a voltage of 15 kV.

23. A power module comprising
a housing with an interior chamber;
a plurality of switch modules mounted within the interior chamber and comprising a plurality of transistors and a plurality of diodes interconnected to facilitate switching power to a load wherein at least one of the plurality of transistors comprises:
a drift layer having a first conductivity type;
a well region in the drift layer having a second conductivity type opposite the first conductivity type;
a source region in the well region, the source region having the first conductivity type and defining a channel region in the well region, wherein the source region comprises a lateral source region adjacent the channel region and a plurality of source contact regions extending away from the lateral source region opposite the channel region;
a body contact region having the second conductivity type between at least two of the plurality of source contact regions and in contact with the well region, wherein the body contact region comprises a plurality of body contact regions that are interspersed between the plurality of source contact regions; and
a source ohmic contact that overlaps at least one of the source contact regions and the body contact region, and that does not overlap the lateral source region.

24. The power module of claim 23 wherein the plurality of body contact regions are spaced apart from the channel region by the lateral source region.

25. The power module of claim 23, wherein the source ohmic contact overlaps the at least one source contact region in a source contact area and the source ohmic contact overlaps the body contact region in a body contact region area;
wherein a ratio of a minimum dimension n1 of the source contact region area to a minimum dimension w1 of the well region is greater than 0.2.

26. The power module of claim 25 wherein the ratio of the minimum dimension n1 of the source contact region area to the minimum dimension w1 of the well region is between 0.3 and 1.

27. The power module of claim 25 wherein the ratio of the minimum dimension n1 of the source contact region area to the minimum dimension w1 of the well region is greater than 0.5.

28. The power module of claim 23, wherein the source ohmic contact overlaps the source region in a source contact area and the source ohmic contact overlaps the body contact region in a body contact region area;
wherein a ratio of a minimum dimension p1 of the body contact region area to a minimum dimension w1 of the well region is greater than 0.2.

29. The power module of claim 28, wherein the ratio of the minimum dimension p1 of the body contact region area to the minimum dimension w1 of the well region is greater than about 0.3.

30. The power module of claim 28 wherein the ratio of the minimum dimension p1 of the body contact region area to the minimum dimension w1 of the well region is greater than about 0.5.

31. The power module of claim 23 wherein the drift layer comprises a wide bandgap semiconductor material.

32. The power module of claim 31 wherein the drift layer comprises silicon carbide.

33. The power module of claim 31 wherein the drift layer comprises silicon carbide having a 2H, 4H and/or 6H polytype.

34. The power module of claim 31 wherein the drift layer comprises silicon carbide having a 3C and/or 15R polytype.

35. The power module of claim 23 wherein the source region has a sheet resistance and the source ohmic contact has a contact resistance, wherein a ratio of the contact resistance to the sheet resistance is greater than 1.

36. The power module of claim 23 wherein each of the plurality of transistors has a reverse blocking voltage in excess of 1000 volts and a current density greater than 700 amperes per square centimeter.

37. The power module of claim 23 wherein one of the plurality of transistors comprises a field effect transistor.

38. The power module of claim 23 wherein one of the plurality of transistors comprises an insulated gate bipolar transistor.

39. The power module of claim 23 wherein a minimum dimension of a source contact area of each of the plurality of transistors is defined by an area of overlap between the source ohmic contact and the at least one of the source contact regions.

\* \* \* \* \*